United States Patent
Park et al.

(10) Patent No.: US 9,859,296 B2
(45) Date of Patent: Jan. 2, 2018

(54) SEMICONDUCTOR DEVICES INCLUDING A CONDUCTIVE PATTERN CONTACTING A CHANNEL PATTERN AND METHODS OF MANUFACTURING THE SAME

(71) Applicants: Se-Jun Park, Hwaseong-si (KR); Jang-Gn Yun, Hwaseong-si (KR); Sung-Min Hwang, Seoul (KR); Ahn-Sik Moon, Hwaseong-si (KR); Zhiliang Xia, Hwaseong-si (KR)

(72) Inventors: Se-Jun Park, Hwaseong-si (KR); Jang-Gn Yun, Hwaseong-si (KR); Sung-Min Hwang, Seoul (KR); Ahn-Sik Moon, Hwaseong-si (KR); Zhiliang Xia, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/160,335

(22) Filed: May 20, 2016

(65) Prior Publication Data

US 2017/0069636 A1   Mar. 9, 2017

(30) Foreign Application Priority Data

Sep. 9, 2015 (KR) .......................... 10-2015-0127841

(51) Int. Cl.
*H01L 29/792* (2006.01)
*H01L 27/1157* (2017.01)
*H01L 27/11582* (2017.01)

(52) U.S. Cl.
CPC .... *H01L 27/1157* (2013.01); *H01L 27/11582* (2013.01)

(58) Field of Classification Search
CPC ........... H01L 27/11582; H01L 29/7926; H01L 29/66833; H01L 27/11578; H01L 27/11556; H01L 29/66666; H01L 21/76816; H01L 21/76877
See application file for complete search history.

(56) References Cited

U.S. PATENT DOCUMENTS

| | | | |
|---|---|---|---|
| 8,907,402 | B2 | 12/2014 | Shinohara |
| 8,916,922 | B2 | 12/2014 | Jang et al. |
| 8,987,805 | B2 | 3/2015 | Nam et al. |

(Continued)

FOREIGN PATENT DOCUMENTS

| | | |
|---|---|---|
| KR | 10-1082098 B1 | 4/2010 |
| KR | 10-2013-0086778 A | 8/2013 |

(Continued)

*Primary Examiner* — Khiem D Nguyen
(74) *Attorney, Agent, or Firm* — Harness, Dickey & Pierce, P.L.C.

(57) ABSTRACT

A semiconductor device includes a plurality of insulation patterns and a plurality of gates alternately and repeatedly stacked on a substrate, a channel pattern extending through the gates in a first direction substantially perpendicular to a top surface of the substrate, a semiconductor pattern between the channel pattern and the substrate, and a conductive pattern between the channel pattern and the semiconductor pattern. The conductive pattern electrically connects the channel pattern to the semiconductor pattern. The conductive pattern contacts a bottom edge of the channel pattern and an upper surface of the semiconductor pattern.

16 Claims, 32 Drawing Sheets

(56) References Cited

U.S. PATENT DOCUMENTS

| | | |
|---|---|---|
| 2013/0134492 A1 | 5/2013 | Yang et al. |
| 2013/0270625 A1* | 10/2013 | Jang .................. H01L 29/7926 |
| | | 257/324 |
| 2013/0334593 A1 | 12/2013 | Seol et al. |
| 2014/0070302 A1 | 3/2014 | Yoo et al. |
| 2015/0050803 A1 | 2/2015 | Lee et al. |
| 2015/0104916 A1 | 4/2015 | Lee et al. |
| 2016/0307908 A1* | 10/2016 | Sharangpani ....... H01L 27/1157 |

FOREIGN PATENT DOCUMENTS

| | | |
|---|---|---|
| KR | 10-2014-0092015 A | 7/2014 |
| KR | 10-2014-0093106 A | 7/2014 |
| KR | 10-2015-0028885 A | 3/2015 |

* cited by examiner

FIG. 7
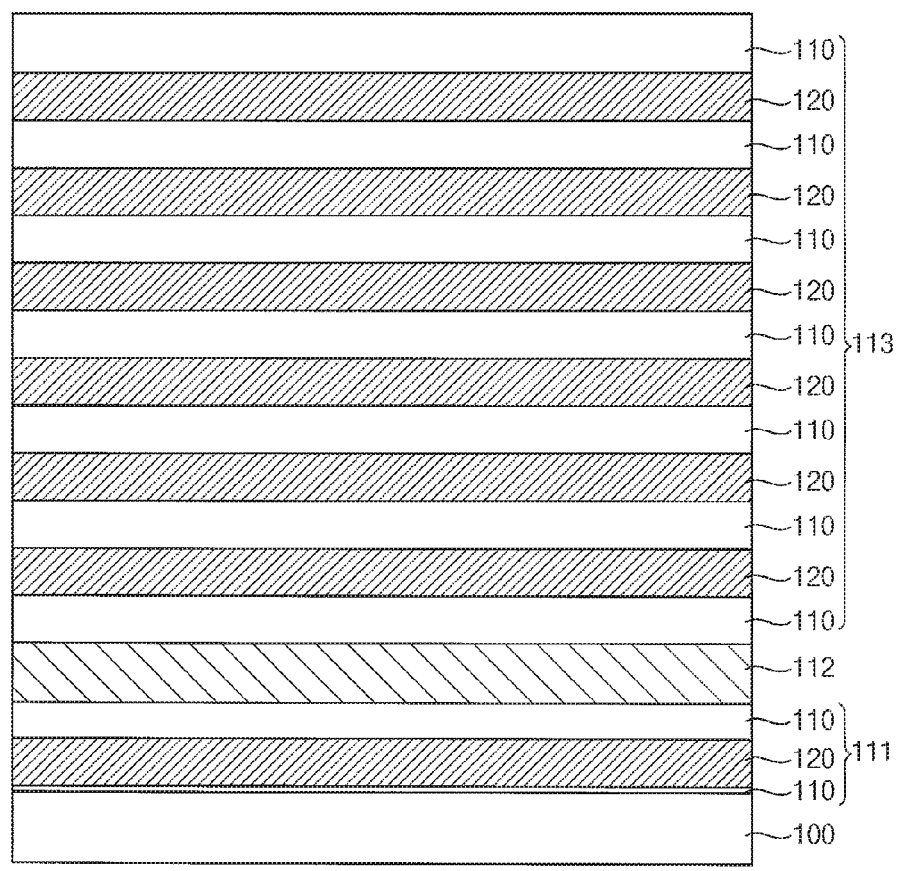
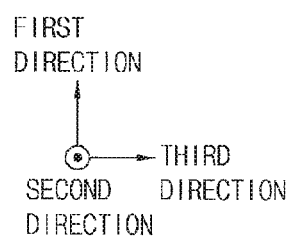

FIG. 24
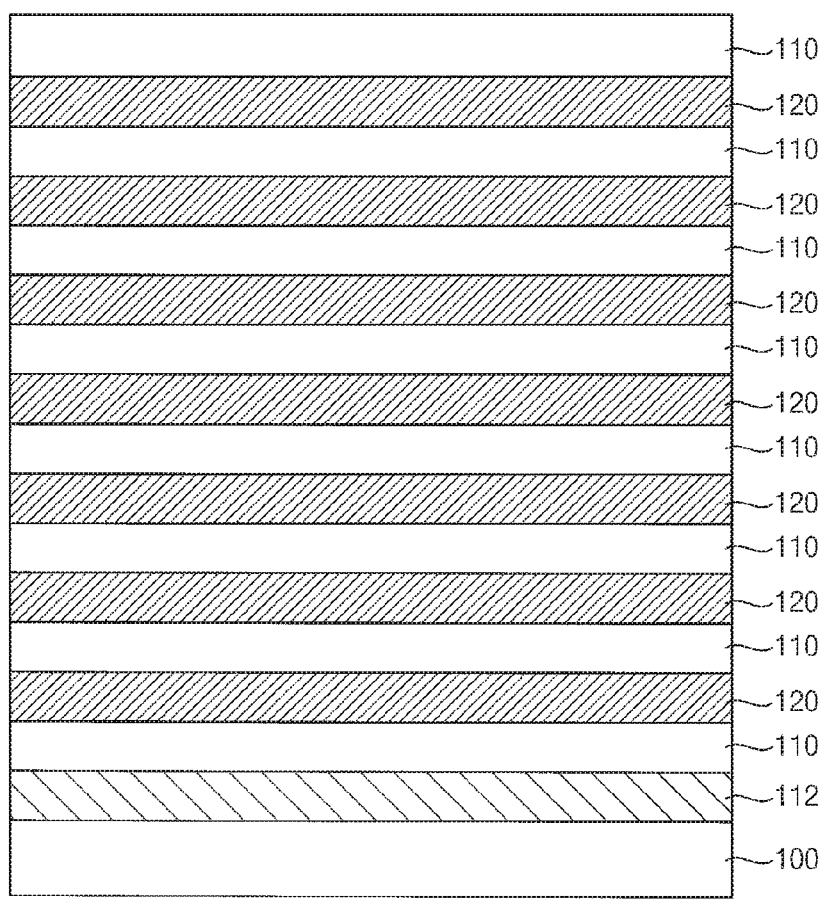
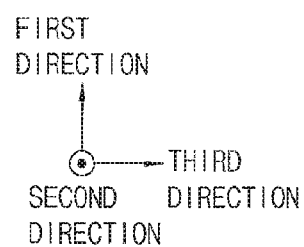

SEMICONDUCTOR DEVICES INCLUDING A CONDUCTIVE PATTERN CONTACTING A CHANNEL PATTERN AND METHODS OF MANUFACTURING THE SAME

CROSS-REFERENCE TO RELATED APPLICATION

This application claims priority under 35 USC §119 to Korean Patent Application No. 10-2015-0127841, filed on Sep. 9, 2015 in the Korean Intellectual Property Office (KIPO), the contents of which are herein incorporated by reference in their entirety.

BACKGROUND

1. Field

Example embodiments relate to semiconductor devices and methods of manufacturing the same. More particularly, example embodiments relate to vertical type memory devices and methods of manufacturing the same.

2. Description of the Related Art

In a vertical type memory device, a vertical channel pattern and a substrate may be electrically connected to each other. However, as an aspect ratio of the vertical channel pattern increases, an electrical connection between the vertical channel pattern and the substrate may be more difficult.

SUMMARY

Example embodiments provide a semiconductor device having good electrical characteristics.

Example embodiments provide a method of manufacturing a semiconductor device having good electrical characteristics.

According to example embodiments, a semiconductor device includes a substrate; a plurality of insulation patterns and a plurality of gates alternately and repeatedly stacked on the substrate; a channel pattern extending through the gates in a first direction substantially perpendicular to a top surface of the substrate; a semiconductor pattern between the channel pattern and the semiconductor pattern; and a conductive pattern between the channel pattern and the semiconductor pattern. The conductive pattern electrically connects the channel pattern to the semiconductor pattern. The conductive pattern may contact a bottom edge of the channel pattern and an upper surface of the semiconductor pattern.

In example embodiments, the conductive pattern may include polysilicon

In example embodiments, the conductive pattern may contact the bottom edge of the channel pattern.

In example embodiments, the conductive pattern may directly contact the bottom edge and a lower sidewall of the channel pattern.

In example embodiments, an insulation structure may be formed between the channel pattern and the semiconductor pattern. The insulation structure may contact an inner sidewall of the conductive pattern.

In example embodiments, a data storage structure may be between the channel pattern and the gates. The data storage structure may include a tunnel insulation pattern, a charge storage pattern and a blocking pattern.

In example embodiments, the insulation structure may include materials that are the same as materials in the data storage structure.

In example embodiments, the insulation structure may include a first pattern, a second pattern and a third pattern on the semiconductor pattern. The first, second, and third patterns may have materials that are the same as materials in the blocking pattern, the charge storage pattern and the tunnel insulation pattern, respectively.

In example embodiments, the data storage structure may extend along a sidewall of the channel pattern, and the data storage structure may have a hollow cylindrical shape.

In example embodiments, the data storage structure may be spaced apart from an upper surface of the semiconductor pattern.

In example embodiments, the conductive pattern may contact the bottom edge of the channel pattern, a lower sidewall of the channel pattern, and a bottom of the data storage structure.

In example embodiments, the insulation structure may include a plurality of stacked patterns, and at least one of the stacked patterns may protrude from a different one of the stacked patterns in a lateral direction.

In example embodiments, a width of each of the stacked patterns of the insulation pattern may be smaller than a width of a bottom of the channel pattern.

In example embodiments, a lower gate may surround a sidewall of the semiconductor pattern, and the lower gate may extend in a direction parallel to the top surface of the substrate.

According to example embodiments, a semiconductor device includes a substrate; a plurality of gates on the substrate, and the gates being spaced apart from each other and the substrate in a first direction substantially perpendicular to a top surface of the substrate; a channel structure extending through the gates in the first direction, the channel structure being spaced apart from the top surface of the substrate, and the channel structure including a channel pattern and a data storage structure extending along a sidewall of the channel pattern; and a conductive pattern between the channel pattern and the substrate. The conductive pattern electrically connects the channel pattern to the substrate. The conductive pattern may contact a bottom edge of the channel pattern and the top surface of the substrate.

In example embodiments, an insulation structure may be between the channel pattern and the semiconductor pattern, and the insulation structure may contact an inner sidewall of the conductive pattern.

In example embodiments, the insulation structure may include stacked patterns, and the stacked patterns may include materials that are the same as materials in the data storage structure.

In example embodiments, a bottom of the data storage structure may be above a bottom of the channel pattern.

In example embodiments, the semiconductor device may further include a semiconductor pattern between the substrate and the conductive pattern, and a lower gate surrounding a sidewall of the semiconductor pattern. The lower gate may extend in a direction parallel to the top surface of the substrate.

According to example embodiments, there is provided a method of manufacturing a semiconductor device. The method includes: forming a structure on a substrate, where the structure includes a first mold structure, a lower sacrificial pattern, and a second mold structure sequentially stacked, and the structure defines a channel hole therethrough that exposes the substrate; forming a semiconductor pattern in a lower portion of the channel hole, the semiconductor pattern contacting the substrate; sequentially forming a preliminary data storage structure and a channel pattern in the channel hole; removing the lower sacrificial pattern to form a first gap exposing the preliminary data storage structure; forming a data storage structure on the sidewall of the channel pattern and an insulation structure on a bottom of the channel pattern, where the forming the data storage structure and the forming the insulation structure include partially etching the preliminary storage structure through the first gap until a sidewall of the channel structure is exposed; and forming a conductive pattern along a sidewall of the insulation structure; and forming a first gate and a plurality of second gates on the substrate. The conductive pattern electrically connects the channel pattern to the semiconductor pattern. The first gate surrounds the semiconductor pattern and extends in a second direction substantially parallel to a top surface of the substrate may be formed. Each of the second gates may surround the data storage structure, and may extend in the second direction.

In example embodiments, an upper surface of the semiconductor pattern may be formed between an upper surface of the lower sacrificial pattern and a lower surface of the lower sacrificial pattern.

In example embodiments, the forming the semiconductor pattern may forming the semiconductor pattern as a single crystal semiconductor using an epitaxial growth process.

In example embodiments, the lower sacrificial pattern may include a material having an etching selectivity with respect to the first mold structure, the second mold structure, the semiconductor pattern, and the channel pattern.

In example embodiments, the lower sacrificial pattern may include one of doped silicon oxide and silicon-germanium.

In example embodiments, the removing the lower sacrificial pattern may include forming a first opening through the first mold structure, the lower sacrificial pattern, and the second mold structure. The removing the lower sacrificial pattern may further include isotropically etching the sacrificial pattern exposed by the first opening may be isotropically etched to form the first gap.

In example embodiments, the forming the conductive pattern may include: conformally forming a conductive layer along inner walls of the first opening and the first gap, and isotropically and partially etching the conductive layer such that the conductive layer remains on the sidewall of the insulation structure.

In example embodiments, after forming the conductive pattern, a second insulation pattern may be further formed to fill the first gap.

In example embodiments, each of the first and second mold structures may include a first insulation layer and a first sacrificial layer alternately and repeatedly stacked, and the first sacrificial layer may have an etching selectivity with respect to the first insulation layer.

In example embodiments, the forming the first gate and the second gates may include forming a second gap and third gaps by removing the first sacrificial layers in the first and second mold structures, forming the first gate in the second gap, and forming the second gates in the third gaps, respectively. The second gap may be in the first mold structure. The third gaps may be in the second mold structure.

According to example embodiments, there is provided a method of manufacturing a semiconductor device. The method may include forming a structure on a substrate. The structure may include a lower sacrificial pattern and a mold structure sequentially stacked, and may define a channel hole therethrough exposing the substrate. The method may further include sequentially forming a preliminary data storage structure and a channel pattern in the channel hole; removing the lower sacrificial pattern to form a first gap exposing the preliminary data storage structure; forming a data storage structure on a sidewall of the channel pattern and an insulation structure on a bottom of the channel pattern; forming a conductive pattern on a sidewall of the insulation structure; and forming a plurality of gates. The forming the data storage structure and the insulation structure may include partially etching the preliminary data storage structure through the first gap. The conductive pattern may electrically connect the channel pattern to the substrate. A plurality of gates may be formed. Each of the gates may surround the data storage structure, and may extend in a second direction substantially parallel to a top surface of the substrate.

In example embodiments, a bottom of the channel pattern may be below an upper surface of the lower sacrificial pattern.

In example embodiments, the lower sacrificial pattern directly may contact the substrate.

In example embodiments, the lower sacrificial pattern may include a material having an etching selectivity with respect to the mold structure, the channel pattern and the substrate.

In example embodiments, when the lower sacrificial pattern is removed, a first opening may be formed through the mold structure and the lower sacrificial pattern. The sacrificial pattern exposed by the first opening may be isotropically etched to form a first gap.

In example embodiments, when the conductive pattern is formed, a conductive layer may be conformally formed along inner walls of the first opening and the first gap. The conductive layer may be isotropically and partially etched such that the conductive layer remains on the sidewall of the insulation structure.

In example embodiments, the partially etching the preliminary data storage structure may be performed using an isotropic etching process.

According to example embodiments, a semiconductor device includes a substrate; a channel pattern on the substrate, the channel pattern extending in a first direction that is vertical to a top surface of the substrate; a conductive pattern between the substrate and an edge part of a bottom surface of the channel pattern, the conductive pattern being electrically connected to the channel pattern through the edge part of the bottom surface of the channel pattern; a data storage structure surrounding the channel pattern; and a plurality of gates surrounding the data storage structure. The plurality of gates are spaced apart from each other in the first direction above the substrate.

In example embodiments, an insulation structure may be between the substrate and a center part of the bottom surface of the channel pattern. The conductive pattern may surround the insulation structure.

In example embodiments, the insulating structure may include a first pattern, a second pattern, and a third pattern sequentially stacked on top of each other and surrounded by the conductive pattern. A width of the second pattern may be different than a width of the first and third patterns.

In example embodiments, the data storage structure may include a tunnel insulating pattern, a charge storage pattern, and a blocking pattern. The first to third patterns may include the same materials as the blocking pattern, the charge storage pattern, and the tunnel insulating pattern, respectively.

In example embodiments, the semiconductor device may include a semiconductor pattern on the substrate. The conductive pattern may be on top of the semiconductor pattern, and the conductive pattern may electrically connect the channel pattern to the semiconductor pattern.

According to example embodiments, the semiconductor pattern and the channel pattern may be spaced apart from each other in the first direction, and may electrically connected to each other by the connection structure. Thus, an open failure between the semiconductor pattern and the channel pattern may decrease.

BRIEF DESCRIPTION OF THE DRAWINGS

Example embodiments will be more clearly understood from the following detailed description of non-limiting embodiments, as illustrated in the accompanying drawings in which like reference characters refer to like parts throughout the different views. The drawings are not necessarily to scale. Emphasis instead is placed upon illustrating principles of inventive concepts. In the drawings.

Figure 4:
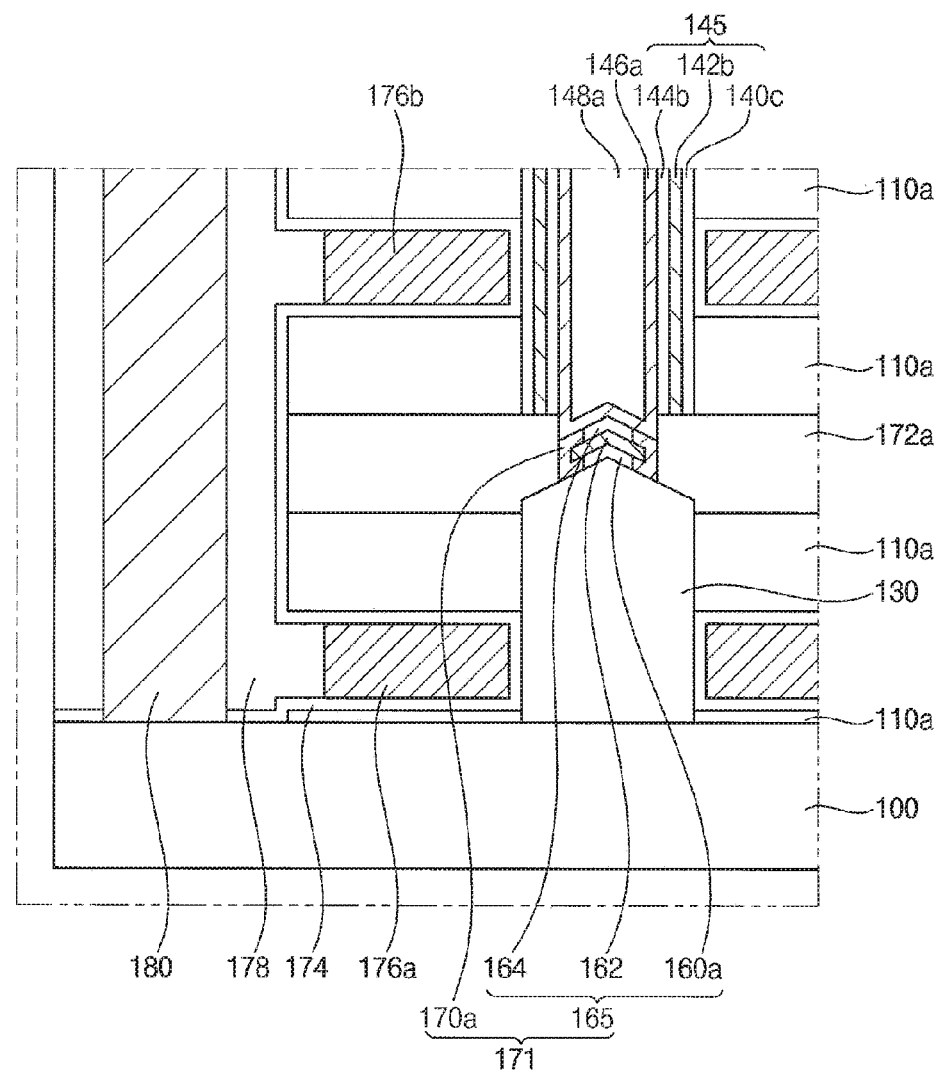
Figure 5:
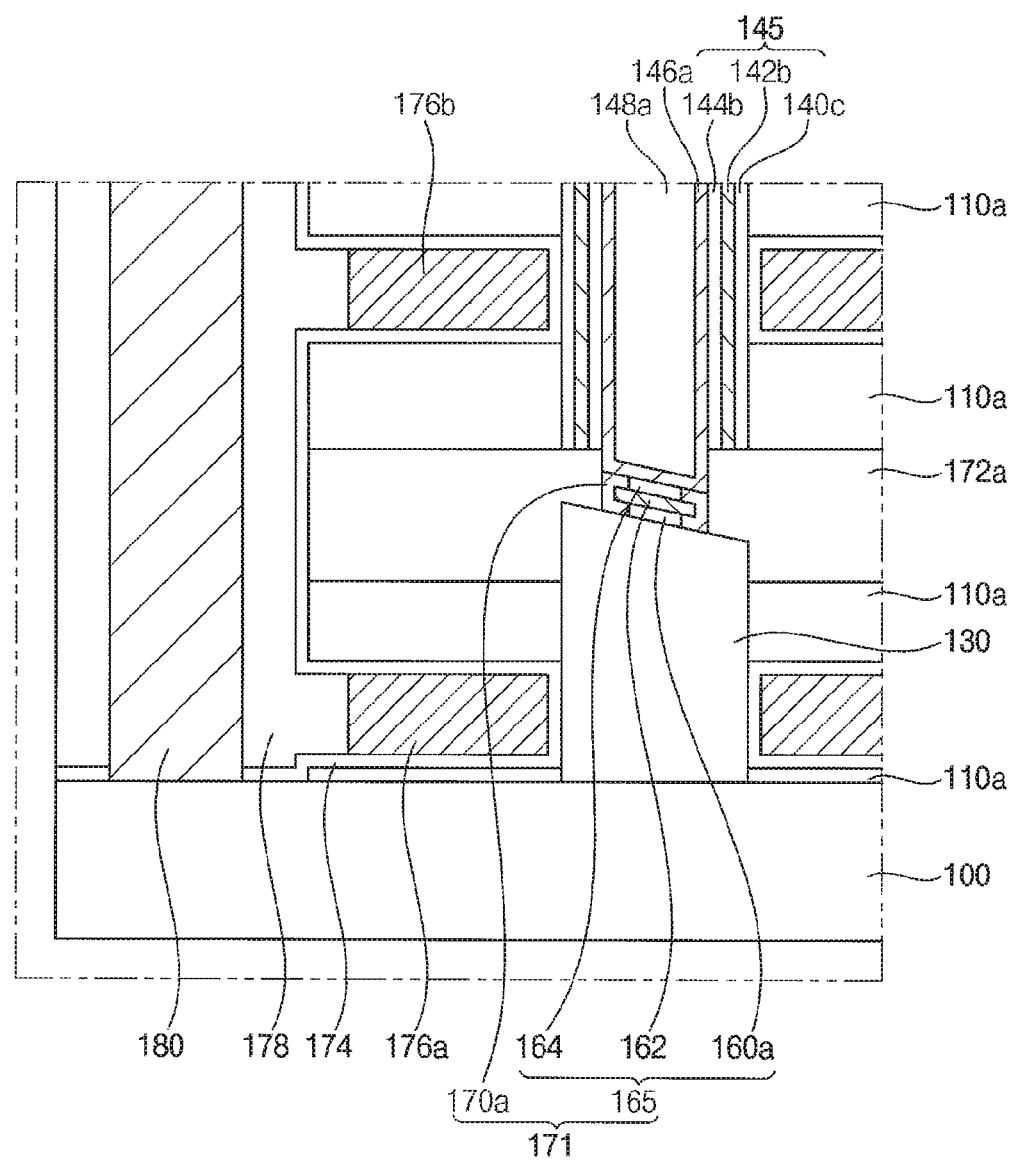
Figure 6:
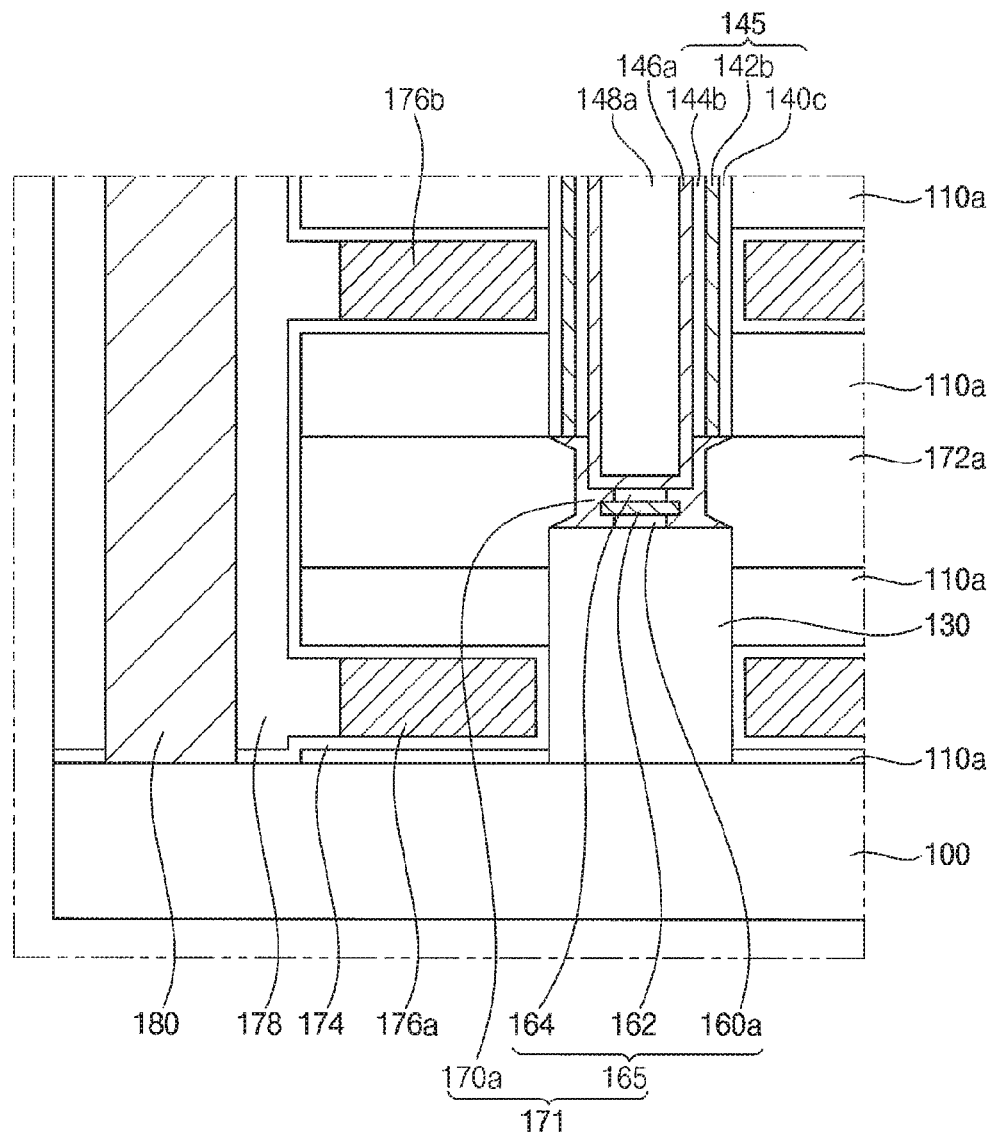

Each of FIGS. 4 to 6 is a cross-sectional view illustrating a vertical type semiconductor device in accordance with example embodiments.

FIGS. 7 to 21 are cross-sectional views illustrating a method of manufacturing a semiconductor device in accordance with example embodiments.

Figure 22:
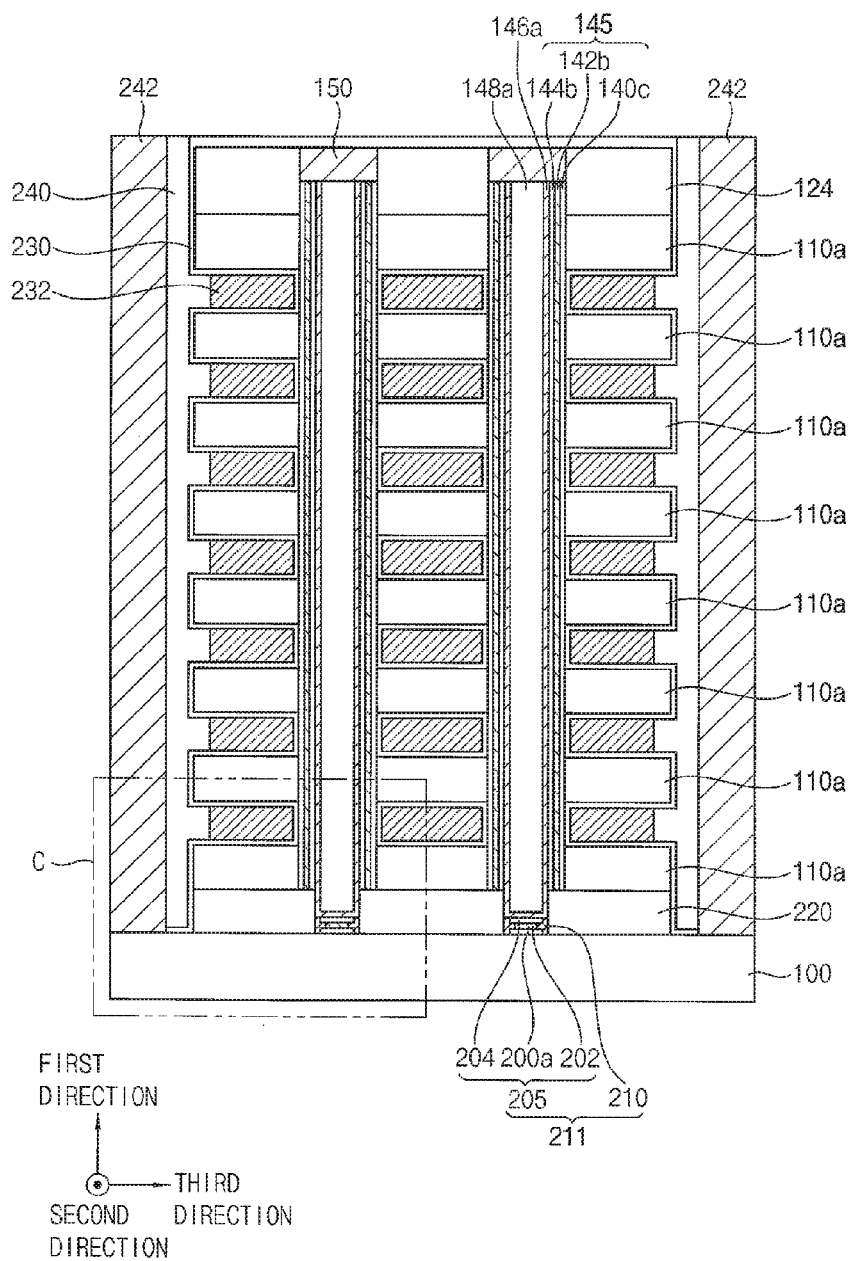
Figure 23:
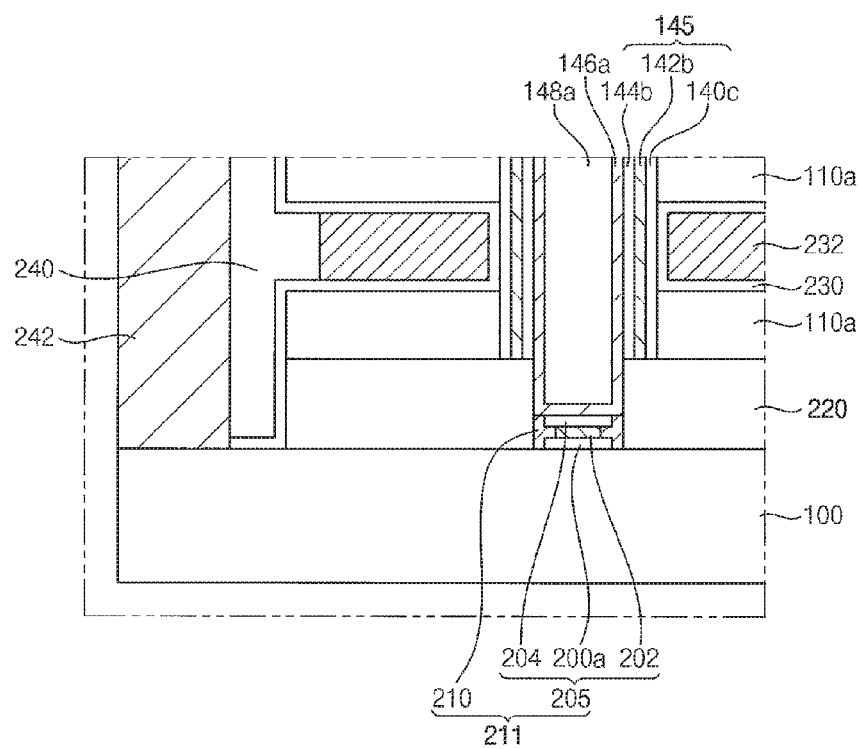

FIGS. 22 and 23 are cross-sectional views illustrating a semiconductor device in accordance with example embodiments.

FIGS. 24 to 31 are cross-sectional views illustrating a method of manufacturing a semiconductor device in accordance with example embodiments.

Figure 32:
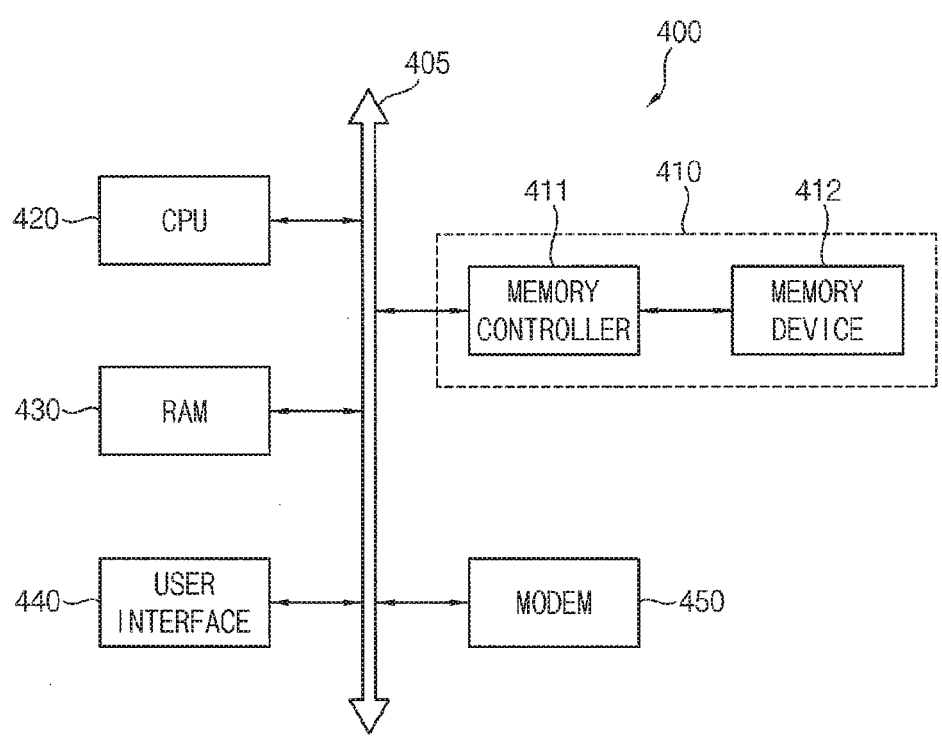

FIG. 32 is a block diagram illustrating a schematic construction of a system in accordance with example embodiments.

DESCRIPTION OF EXAMPLE EMBODIMENTS

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent"). Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIGS. 1, 2A, 2B and 3 are cross-sectional views, a perspective view and a plan view illustrating a vertical type semiconductor device in accordance with example embodiments. Each of FIGS. 4, 5 and 6 is a cross-sectional view illustrating a vertical type semiconductor device in accordance with example embodiments.

Figure 1:
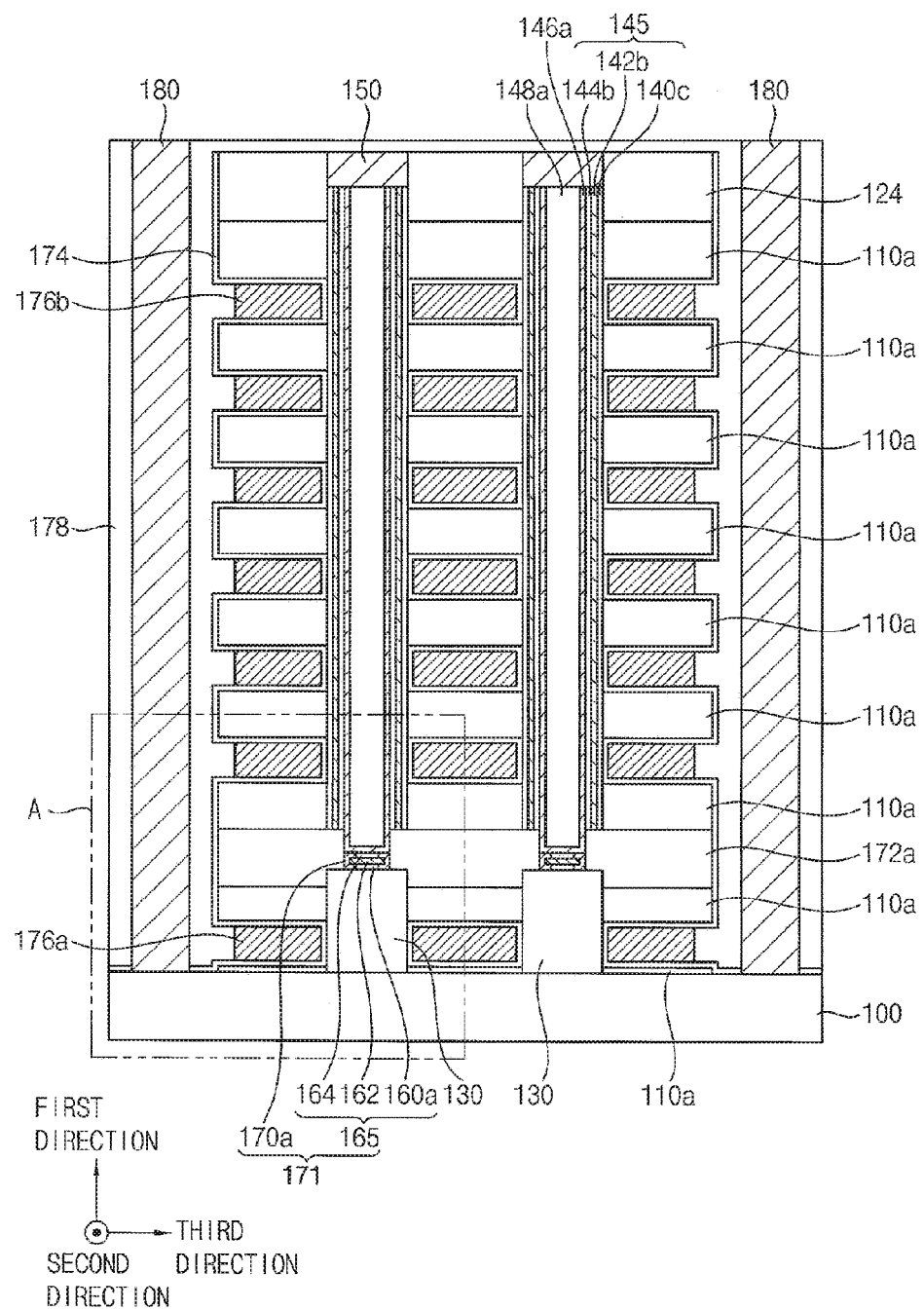
FIGS. 1, 2A, 2B and 3 are cross-sectional views, a perspective view and a plan view illustrating a vertical type semiconductor device in accordance with example embodiments.
Figure 2A:
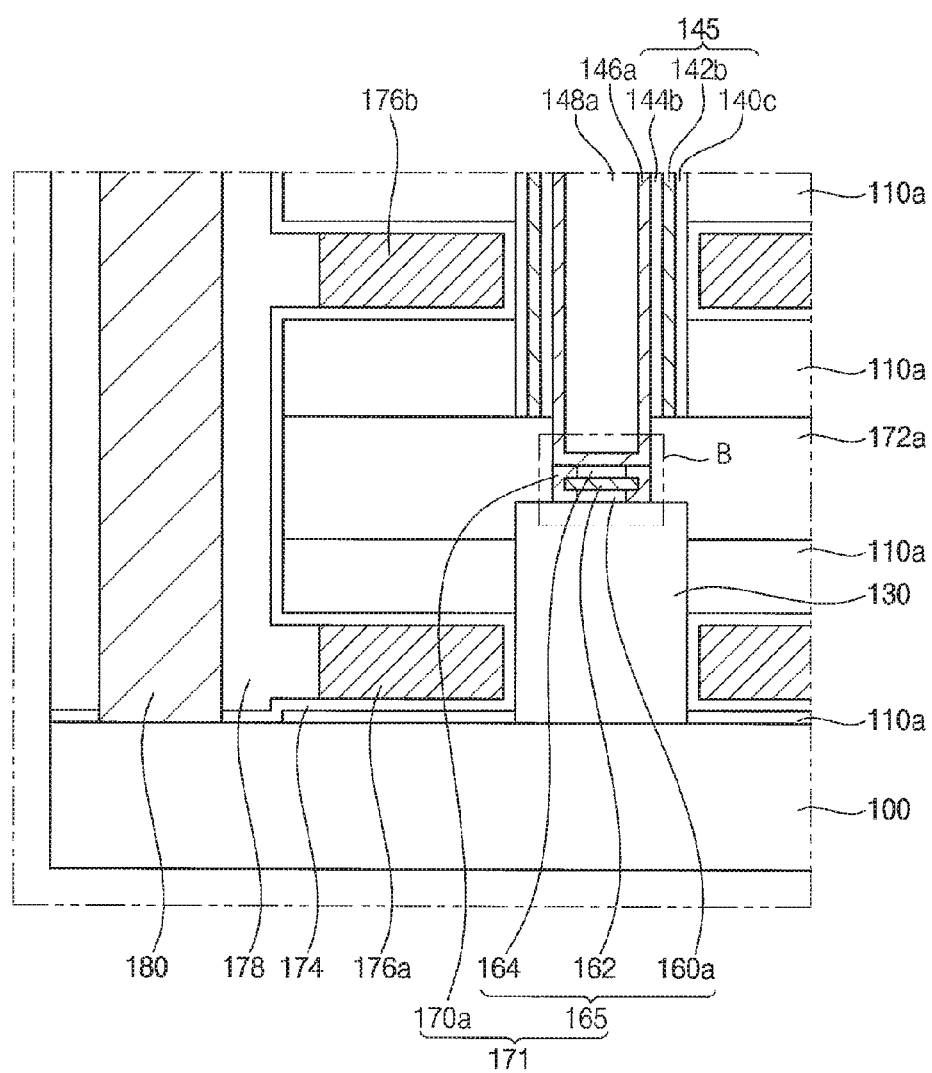
Figure 2B:
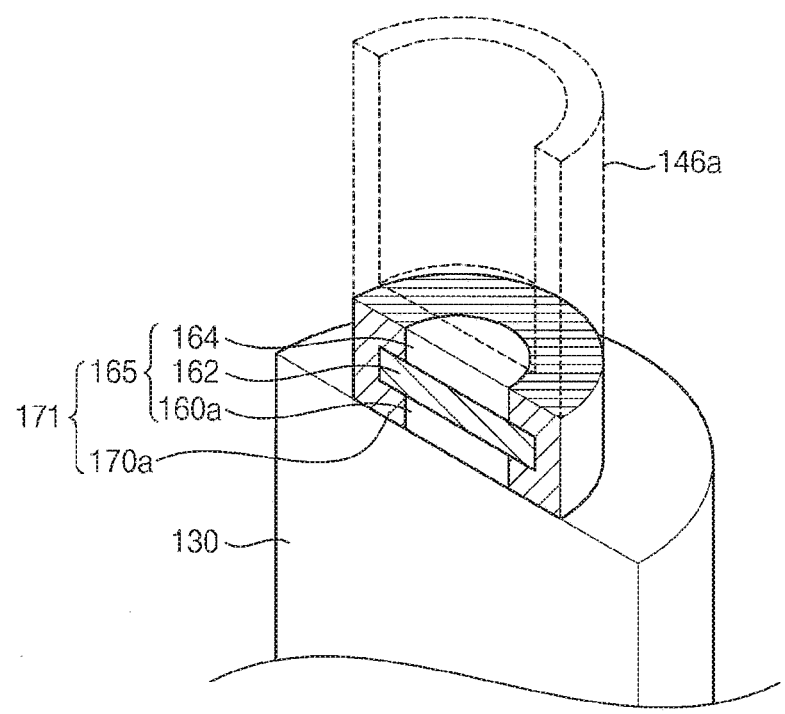
Figure 3:
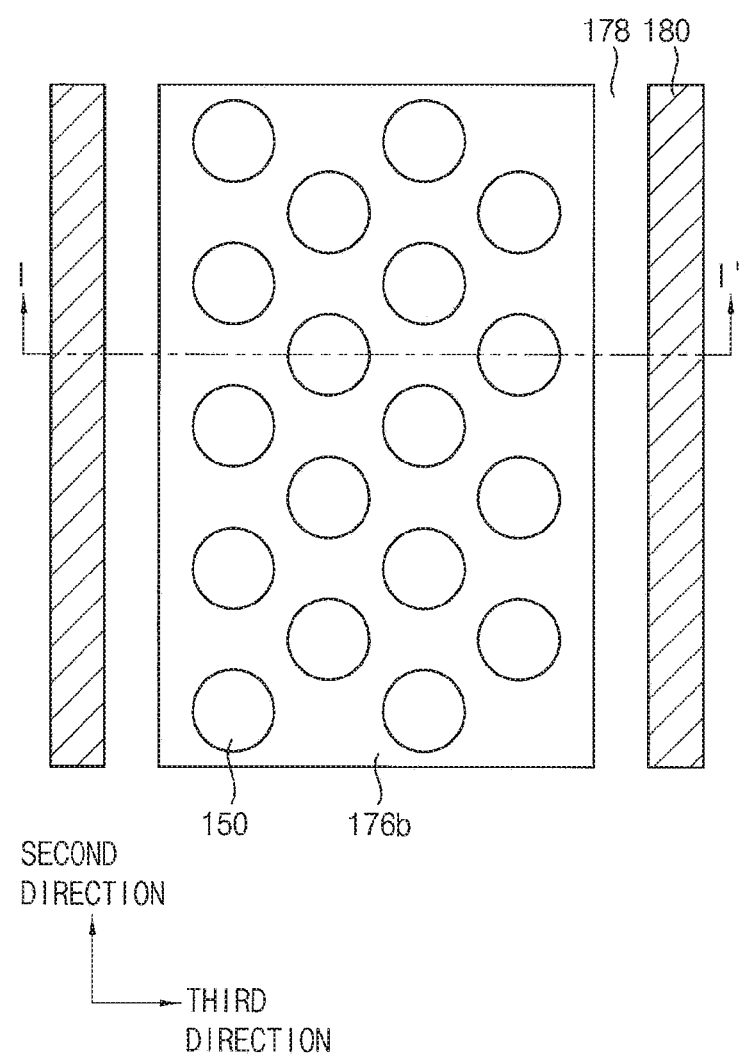

Particularly, FIG. 1 is a cross-sectional view taken along a line I-I' in FIG. 3. FIG. 2A is an enlarged cross-sectional view of a portion "A" in FIG. 1, and FIG. 2B is a partial cutaway perspective view a portion "B" in FIG. 2A. FIG. 3 illustrates a layout of channel structures. Each of FIGS. 4 to 6 illustrates an enlarged cross-sectional view of a portion "A" in FIG. 1.

In all figures in this specification, a direction substantially perpendicular to a top surface of a substrate is referred to as a first direction, and two directions substantially parallel to the top surface of the substrate and substantially perpendicular to each other are referred to as a second direction and a third direction, respectively. Additionally, a direction indicated by an arrow in the figures and a reverse direction thereto are considered as the same direction.

Referring to FIGS. 1, 2A, 2B and 3, insulating interlayers and gates may be alternately and repeatedly formed on a substrate 100. A channel pattern 146a may extend in the first direction. A semiconductor pattern 130 may be formed on the substrate 100, and may be formed under the channel pattern 146a. A connection structure 171 may be formed between the semiconductor pattern 130 and the channel pattern 146a, and may electrically connect the semiconductor pattern 130 with the channel pattern 146a. The connection structure 171 may include a conductive pattern 170a contacting a bottom edge of the channel pattern 146a and contacting an upper surface of the semiconductor pattern 130.

The substrate 100 may include a semiconductor material, e.g., silicon, germanium, etc. or a semiconductor on insulator (e.g., silicon on silicon dioxide).

The semiconductor pattern 130 may have a pillar shape. In example embodiments, the semiconductor pattern 130 may include single crystalline material, e.g., single crystalline silicon. Alternatively, the semiconductor pattern 130 may include a polycrystalline material such as polysilicon. The semiconductor pattern 130 may be doped with impurities or may be non-doped.

The upper surface of the semiconductor pattern 130 may have various shapes.

In example embodiments, the upper surface of the semiconductor pattern 130 may be substantially flat. In this case, the upper surface of the semiconductor pattern 130 may have substantially the same height, regardless of positions thereof, as shown in FIGS. 2A and 2B.

In example embodiments, the upper surface of the semiconductor pattern 130 may include a protruding portion. For example, a central portion of the semiconductor pattern 130 may protrude from an edge portion of the semiconductor pattern 130, as shown in FIG. 4.

In example embodiments, the upper surface of the semiconductor pattern 130 may have different heights according to positions thereof. For example, the upper surface of the semiconductor pattern 130 may have a slope, as shown in FIG. 5.

In example embodiments, the channel pattern 146a may have a cup shape, and a bottom of the channel pattern 146a may contact the connection pattern 171. A filling insulation pattern 148a may be formed on the channel pattern 146a to fill an inner space formed by the channel pattern 146a having the cup shape. In example embodiments, the channel pattern 146a may include polysilicon, and the filling insulation pattern 148a may include silicon oxide, but example embodiments are not limited thereto. The channel pattern 146a may be doped with impurities.

In example embodiments, the channel pattern 146a may have a pillar shape. In this case, the filling insulation pattern 148a may not be formed on the channel pattern 146a.

The bottom of the channel pattern 146a may overlap the upper surface of the semiconductor pattern 130. A width of the bottom of the channel pattern 146a may be less than a width of the upper surface of the semiconductor pattern 130.

A data storage structure 145 may be disposed along an outer sidewall of the channel pattern 146a. The data storage structure 145 may include a tunnel insulation pattern 144b, a charge storage pattern 142b and a first blocking pattern 140c. Each of the tunnel insulation pattern 144b, the charge storage pattern 142b and the first blocking pattern 140c may have a hollow cylindrical shape.

In example embodiments, the tunnel insulation pattern 144b may include an oxide, e.g., silicon oxide. The charge storage pattern 142b may include a nitride, e.g., silicon nitride. The first blocking pattern 140c may include an oxide, e.g., silicon oxide.

The data storage structure 145 may be spaced apart from the upper surface of the semiconductor pattern 130. A bottom of the data storage structure 145 may be higher than the bottom of the channel pattern 130.

The connection structure 171 may be formed between the semiconductor pattern 130 and the channel pattern 146a in the first direction. Thus, the semiconductor pattern 130, the connection structure 171 and the channel pattern 146a may be sequentially stacked, and may form a channel structure having a pillar shape. The semiconductor pattern 130 and the channel pattern 146a may be electrically connected to the substrate 100.

The connection structure 171 may include the conductive pattern 170a and an insulation structure 165. The insulation structure 165 may contact an inner sidewall of the conductive pattern 170a, and may be formed between the channel pattern 146a and the semiconductor pattern 130.

The conductive pattern 170a may have a hollow cylindrical shape, and may contact the bottom edge of the channel pattern 146a and the upper surface of the semiconductor pattern 130. The insulation structure 165 may contact a central bottom of the channel pattern 146a and the upper surface of the semiconductor pattern 130.

In example embodiments, the conductive pattern 170a may include doped polysilicon. The channel pattern 146a and the semiconductor pattern 130 may be electrically connected to each other by the conductive pattern 170a. The insulation structure 165 may be formed on the semiconductor pattern 130, and may support the bottom of the channel pattern 146a.

According to the shape of the upper surface of the semiconductor pattern 130, the shape of a bottom of each of the insulation structure 165 and the channel pattern 146a may change.

In example embodiments, the bottoms of the insulation structure 165 and the channel pattern 146a may be substantially flat, as shown in FIGS. 2A and 2B.

In example embodiments, central bottoms of the insulation structure 165 and the channel pattern 146a may protrude from bottom edges of the insulation structure 165 and the channel pattern 146a, respectively, as shown in FIG. 3.

In example embodiments, the bottoms of the insulation structure 165 and the channel pattern 146a may have a slope, as shown in FIG. 4.

The insulation structure 165 may include materials that are the same as or substantially the same as materials included in the data storage structure 145. In example embodiments, the insulation structure 165 may include a first pattern 160a, a second pattern 162 and a third pattern 164 sequentially stacked. The first pattern 160a may include a material the same as or substantially the same as a material of the first blocking pattern 140c, the second pattern 162 may include a material the same as or substantially the same as a material of the charge storage pattern 142b, and the third pattern 164 may include a material the same as or substantially the same as a material of the tunnel insulation pattern 144b.

A sidewall of the insulation structure 165 may be uneven along the first direction, and may have concave and convex portions. In example embodiments, at least one of the first, second and third patterns 160a, 162 and 164 included in the insulation structure 165 may laterally protrude from the others. For example, the second pattern 162 may laterally protrude from the first and third patterns 160a and 164. For example, at least one of the first and third patterns 160a and 164 may laterally protrude from the second pattern 162.

The first, second and third patterns 160a, 162 and 164 may not laterally protrude from the bottom edge of the channel pattern 146a. That is, a width of each of the first, second and third patterns 160a, 162 and 164 may be less than the width of the bottom of the channel pattern 146a.

The conductive pattern 170a may cover a sidewall of the insulation structure 165. The conductive pattern 170a may fill a space defined by the sidewall of the insulation structure 165, the upper surface of the semiconductor pattern 130 and the bottom of the channel pattern 146a.

In example embodiments, the conductive pattern 170a may contact the bottom edge of the channel pattern 146a, and may have a hollow cylindrical shape. In this case, a width the connection structure 171 may be less than the width of the upper surface of the semiconductor pattern 130.

In example embodiments, the conductive pattern 170a may contact the bottom edge of the channel pattern 146a and a lower sidewall of the channel pattern 146a.

In example embodiments, the conductive pattern 170a may contact the bottom edge of the channel pattern 146a, a lower sidewall of the channel pattern 146a, the bottom of the data storage structure 145 and the upper surface of the semiconductor pattern 130, as shown in FIG. 6.

The gates may include a first gate 176a and a plurality of second gates 176b.

The first gate 176a may serve as a ground selection line (GSL). The semiconductor pattern 130 may be formed through the first gate 176a.

In example embodiments, one first gate 176a may surround the semiconductor pattern 130. In example embodiments, a plurality of first gates 176a may be formed to be spaced apart from each other in the first direction, and each of the first gates 176a may surround the semiconductor pattern 130.

Each of the second gates 176b may serve as a word line or a string selection line (SSL). The channel pattern 146a may be formed through the second gates 176b.

In example embodiments, one SSL or a plurality of SSLs may be formed on the channel pattern 146a. A plurality of word lines may be formed between the GSL and the SSL.

A first distance in the first direction between the first and second gates 176a and 176b may be greater than a second distance in the first direction between the second gates 176b.

In example embodiments, the first and second gates 176a and 176b may include a metal having a low resistance, e.g., tungsten, titanium, tantalum, platinum, etc., and/or a metal nitride, e.g., titanium nitride, tantalum nitride, etc. The first and second gates 176a and 176b may include the same as or substantially the same material.

The first and second gates 176a and 176b may be arranged in the third direction, and may extend in the second direction surrounding a plurality of channel structures.

In example embodiments, a second blocking layer 174 may be formed between the first gate 176a and the semiconductor pattern 130 and between the second gate 176b and the data storage structure 145. The second blocking layer 174 may include a metal oxide having a dielectric constant higher than a dielectric constant of the first blocking pattern 140c. The second blocking layer 174 may cover surfaces of the first and second gates 176a and 176b, and may extend in the first direction.

In example embodiments, the second blocking layer 174 may include, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

The insulating interlayer may include a plurality of first insulation patterns 110a and a second insulation pattern 172a.

In example embodiments, each of the first insulation patterns 110a may be formed between the second gates 176b. A stacked structure including the first insulation pattern 110a, the second insulation pattern 172a and the first insulation pattern 110a may be formed between the first and second gates 176a and 176b. After forming the first insulation patterns 110a, the second insulation pattern 172a may be formed by an additional deposition process. However, the second insulation pattern 172a may include a material the same as or substantially the same as a material of each of the first insulation patterns 110a. The first and second insulation patterns 110a and 172a may include, e.g., silicon oxide. The first and second insulation patterns 110a and 172a may be formed by a plasma enhanced CVD process, a high density plasma CVD process, etc.

The first insulation pattern 110a may be formed between the first gate 176a and the substrate 100.

The first and second gates 176a and 176b extending in the second direction may be divided by a first opening extending in the second direction. A third insulation pattern 178 may be formed a sidewall of the first opening. The third insulation pattern 178 may include, e.g., silicon oxide.

A second opening may be defined by the third insulation pattern 178, and a conductive pattern 180 may be formed to fill the second opening. The conductive pattern 180 may include a metal having a low resistance, e.g., tungsten, titanium, tantalum, platinum, etc., and/or a metal nitride, e.g., titanium nitride, tantalum nitride, etc.

The conductive pattern 180 may serve as a common source line (CSL). An impurity region may be formed at an upper portion of the substrate 100 contacting the conductive pattern 180.

A pad 150 may be formed on the filling insulation pattern 148a, the channel pattern 146a and the data storage structure 145. A bit line contact plug (not shown) may be formed on the pad 150, and a bit line (not shown) may be formed on the bit line contact plug.

In the vertical type semiconductor device, the semiconductor pattern 130 and the channel pattern 146a may be electrically connected to each other by the connection structure 171. Thus, even though the number of the second gates stacked on the channel pattern 146a may increase, the possibility of not connection between the semiconductor pattern 130 and the channel pattern 146a may decrease.

FIGS. 7 to 21 are cross-sectional views illustrating a method of manufacturing a semiconductor device in accordance with example embodiments.

Particularly, FIGS. 12 to 16 are enlarged cross-sectional views of a portion of the semiconductor device.

Referring to FIG. 7, a first mold structure 111, a lower sacrificial layer 112 and a second mold structure 113 may be sequentially formed on a substrate 100.

The substrate 100 may include a semiconductor material, for example, silicon and/or germanium, or a semiconductor on insulator.

In example embodiments, a first insulation layer 110 may be formed on the substrate 100, and a first sacrificial layer 120 and a first insulation layer 110 may be alternately formed on the first insulation layer 110 to form the first mold structure 111. In example embodiments, a plurality of first sacrificial layers 120 and/or a plurality of first insulation layers 110 may be alternately formed. In example embodiments, an uppermost layer of the first mold structure 111 may be the first insulation layer 110. The number of the first sacrificial layers 120 in the first direction may be same as the number of first gates in the first direction subsequently formed. When a cell string includes one GSL, one first sacrificial layer 120 may be formed on the first insulation layer 110, as shown in FIG. 7.

In example embodiments, the first insulation layer 110 and the first sacrificial layer 120 may be formed by a chemical vapor deposition (CVD) process, a plasma enhanced chemical vapor deposition (PE-CVD) process, an atomic layer deposition (ALD) process, etc. One of the first insulation layers 110 directly contacting the substrate 100 may be formed by a thermal oxidation process. In example embodiments, the first insulation layer 110 directly contacting the substrate 100 may have a thickness different from each of thicknesses of other first insulation layers 110.

In example embodiments, the first insulation layer 110 may be formed of silicon oxide. For example, the first insulation layer 110 may include plasma enhanced tetraethyl orthosilicate (PE-TEOS), high density plasma (HDP) oxide, or plasma enhanced oxide (PEOX). In example embodiments, the first sacrificial layer 120 may have an etching selectivity with respect to the first insulation layer 110. The first sacrificial layers 120 may be formed of, e.g., silicon nitride.

The lower sacrificial layer 112 may be formed on the first mold structure 111. The lower sacrificial layer 112 may include a material having an etching selectivity with respect to the first and second mold structures 111 and 113, a channel pattern 146a (refer to FIG. 10) and a semiconductor pattern 130 (refer to FIG. 8) subsequently formed. That is, the lower sacrificial layer 112 may include a material having an etching selectivity with respect to oxide and nitride included in the first and second mold structures 111 and 113. Also, the lower sacrificial layer 112 may include a material having an etching selectivity with respect to silicon included in the channel pattern 146a and the semiconductor pattern 130.

In example embodiments, the lower sacrificial layer 112 may be formed of silicon oxide having an etch rate higher than an etch rate of the first insulation layer 110. That is, the lower sacrificial layer 112 may be formed of silicon oxide having a high etch rate with respect to an etchant including hydrofluoric acid in a wet etch process.

In example embodiments, the lower sacrificial layer 112 may be formed of a material different from a material of the first insulation layer 110. Alternatively, the lower sacrificial layer 112 may be formed of a material the same as or substantially the same as a material of the first insulation layer 110, however, the material may be further doped with impurities. Alternatively, the lower sacrificial layer 112 may be formed of a material doped with impurities that is the same as or substantially the same as the material of the first insulation layer 110, however, a doping concentration of the lower sacrificial layer 112 may be higher than a doping concentration of the first insulation layer 110. Alternatively, the lower sacrificial layer 112 may be formed using a material the same as or substantially the same as the material of the first insulation layer 110, however, may be deposited at a relatively low temperature so as to have porous therein, and thus may have an etch rate higher than that of the first insulation layer 110.

For example, when the first insulation layer 110 includes PEOX, the lower sacrificial layer 112 may be formed of, e.g., boro tetraethyl orthosillicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), etc., and when the first insulation layer 110 includes plasma enhanced tetraethyl ortho silicate (PE-TEOS), the lower sacrificial layer 112 may include, e.g., PEOX, BTEOS, PTEOS, BPTEOS, BSG, PSG, BPSG, etc. Additionally, when the first insulation layer 110 includes high density plasma (HDP) oxide, the lower sacrificial layer 112 may include, e.g., PE-TEOS, PEOX, BTEOS, PTEOS, BPTEOS, BSG, PSG, BPSG, etc.

In example embodiments, when the semiconductor pattern 130 includes silicon, the lower sacrificial layer 112 may include, e.g., silicon germanium.

In example embodiments, the lower sacrificial layer 112 may be formed to have a thickness greater than a sum of thicknesses of a blocking layer 140 (refer to FIG. 9), a charge storage layer 142 (refer to FIG. 9), a tunnel insulation layer 144 (refer to FIG. 9) and a channel layer 146 (refer to FIG. 9) subsequently formed.

A plurality of first insulation layers 110 and a plurality of first sacrificial layers 120 may be alternately and repeatedly formed on the lower sacrificial layer 112, so that the second mold structure 113 may be formed. The number of the first sacrificial layers 120 in the second mold structure 113 may be the same as or substantially the same as the number of second gates subsequently formed. That is, the number of the first sacrificial layers 120 in the second mold structure 113 may be the same as or substantially the same as a sum of the numbers of word lines and string selection lines (SSL) in a cell string.

Figure 8:
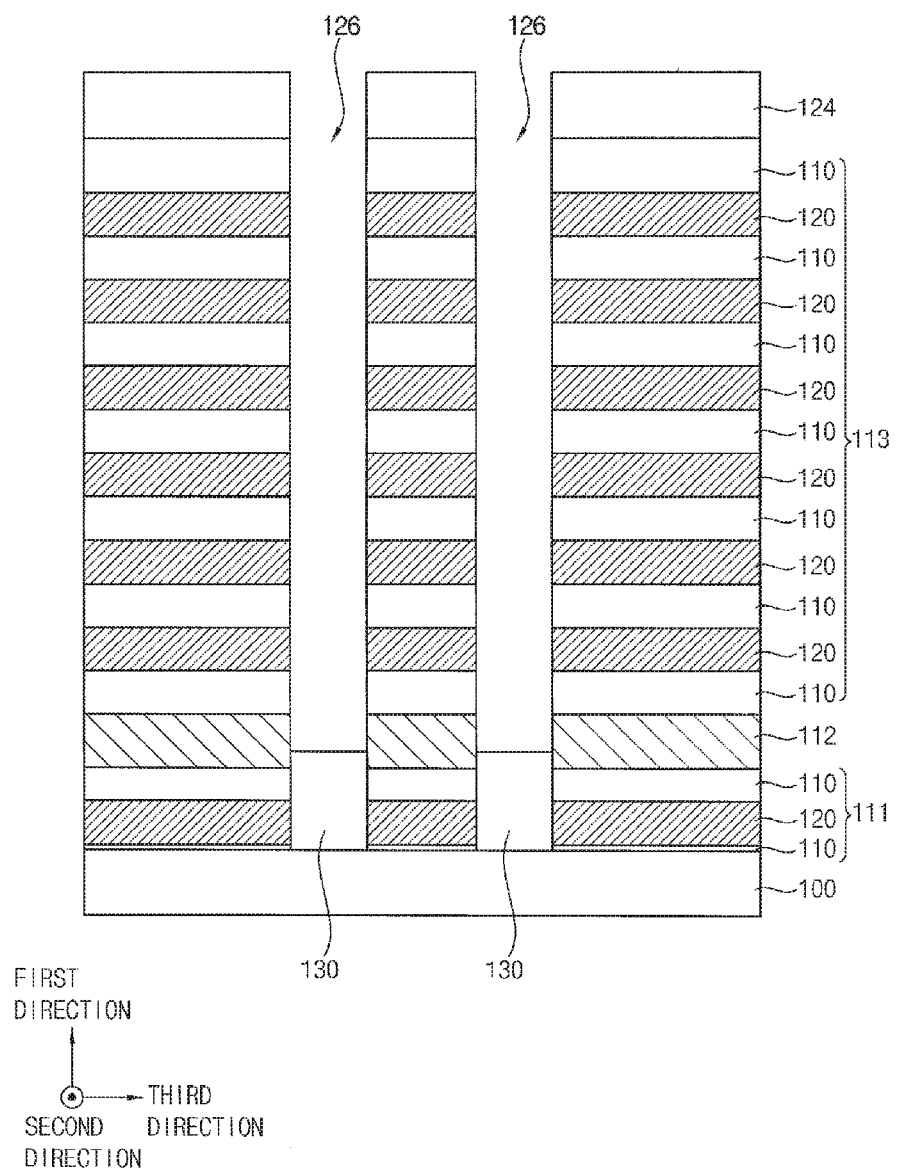

Referring to FIG. 8, an upper insulation layer 124 may be formed on the second mold structure 113. In example embodiments, the upper insulation layer 124 may be formed by a CVD process, a PECVD process, an ALD process, etc. In example embodiments, the upper insulation layer 124 may be formed of silicon oxide. Alternatively, the upper insulation layer 124 may not be formed.

A plurality of holes 126 may be formed through the upper insulation layer 124, the first insulation layer 110, the first sacrificial layer 120 and the lower sacrificial layer 112 to expose a top surface of the substrate 100. The semiconductor pattern 130 may be formed to fill a lower portion of each of the holes 126.

In example embodiments, a hard mask (not shown) may be formed on the upper insulation layer 124, and the upper insulation layer 124, the first insulation layer 110, the first sacrificial layer 120 and the lower sacrificial layer 112 may be anisotropically etched using the hard mask as an etching mask to form the holes 126.

In example embodiments, the holes 126 may be arranged in the second and the third directions to define a hole array.

The semiconductor pattern 130 may be formed by a selective epitaxial growth (SEG) process using the exposed top surface of the substrate 100 as a seed. Thus, the semiconductor pattern 130 may include single crystalline silicon or single crystalline germanium according to the material of the substrate 100. Alternatively, an amorphous silicon layer may be formed to partially fill the holes 126, and a laser epitaxial growth (LEG) process or a solid phase epitaxy (SPE) process may be performed on the amorphous silicon layer to form the semiconductor pattern 130.

In example embodiments, an upper surface of the semiconductor pattern 130 may be formed between an upper surface and a lower surface of the lower sacrificial layer 112. The semiconductor pattern 130 may have a pillar shape. The upper surface of the semiconductor pattern 130 may have various shapes according to the SEG process.

In example embodiments, the upper surface of the semiconductor pattern 130 may be substantially flat.

In example embodiments, the upper surface of the semiconductor pattern 130 may have a protruding portion. For example, a center portion of the semiconductor pattern 130 may protrude from an edge portion of the semiconductor pattern 130. In this case, the vertical semiconductor device of FIG. 3 may be manufactured by subsequent processes.

In example embodiments, the upper surface of the semiconductor pattern 130 may have a slope. In this case, the vertical semiconductor device of FIG. 4 may be manufactured by subsequent processes.

Figure 9:
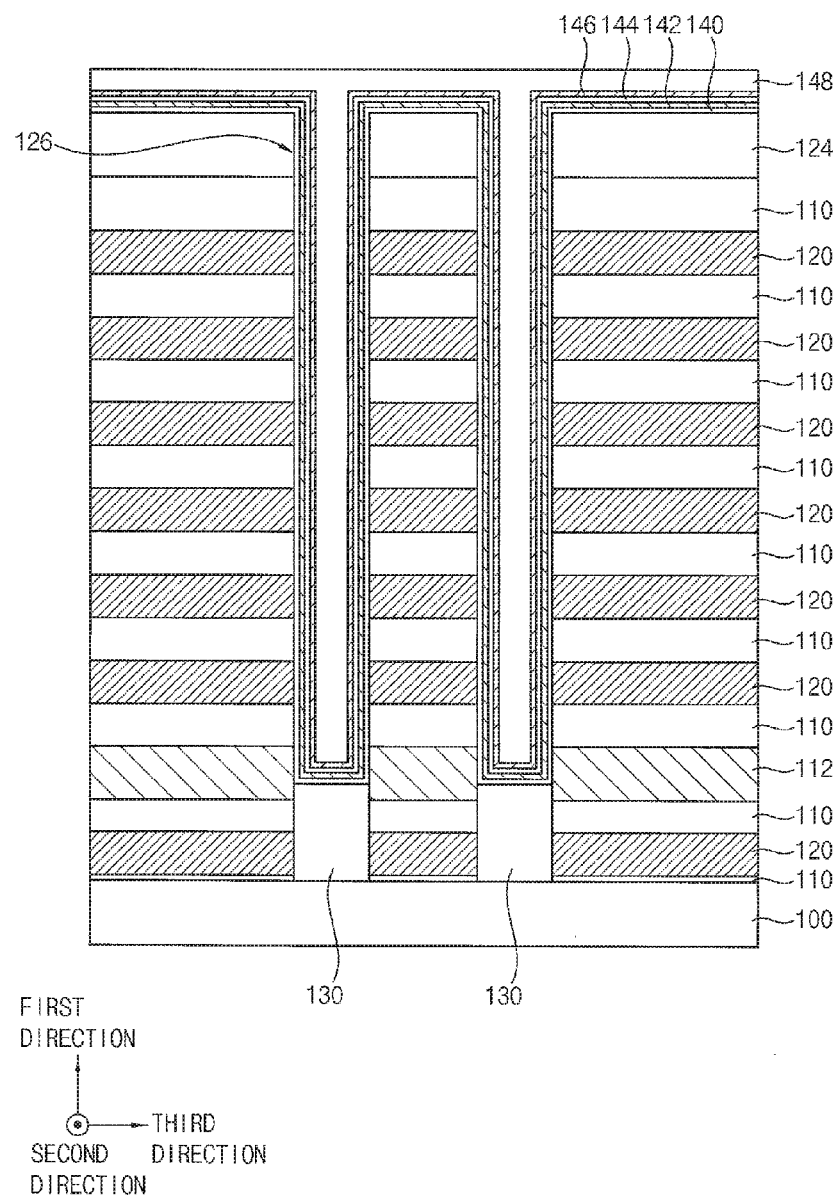

Referring to FIG. 9, the blocking layer 140, the charge storage layer 142, the tunnel insulation layer 144 and the channel layer 146 may be sequentially and conformally formed on an inner sidewall of the holes 126, the upper surface of the semiconductor pattern 130 and the upper insulation layer 124. A filling insulation layer 148 may be formed on the channel layer 146 to sufficiently fill the holes 126.

In example embodiments, the blocking layer 140 may be formed of an oxide, e.g., silicon oxide, the charge storage layer 142 may be formed of a nitride, e.g., silicon nitride, and the tunnel insulation layer 144 may be formed of an oxide, e.g., silicon oxide. A structure including the blocking layer 140, the charge storage layer 142 and the tunnel insulation layer 144 may serve as a charge storage layer.

In example embodiments, the channel layer 146 may be formed of, e.g., doped polysilicon or undoped polysilicon. A bottom of the channel layer 146 may be lower than the upper surface of the lower sacrificial layer 112.

In example embodiments, the filling insulation layer 148 may be formed of, e.g., silicon oxide.

Figure 10:
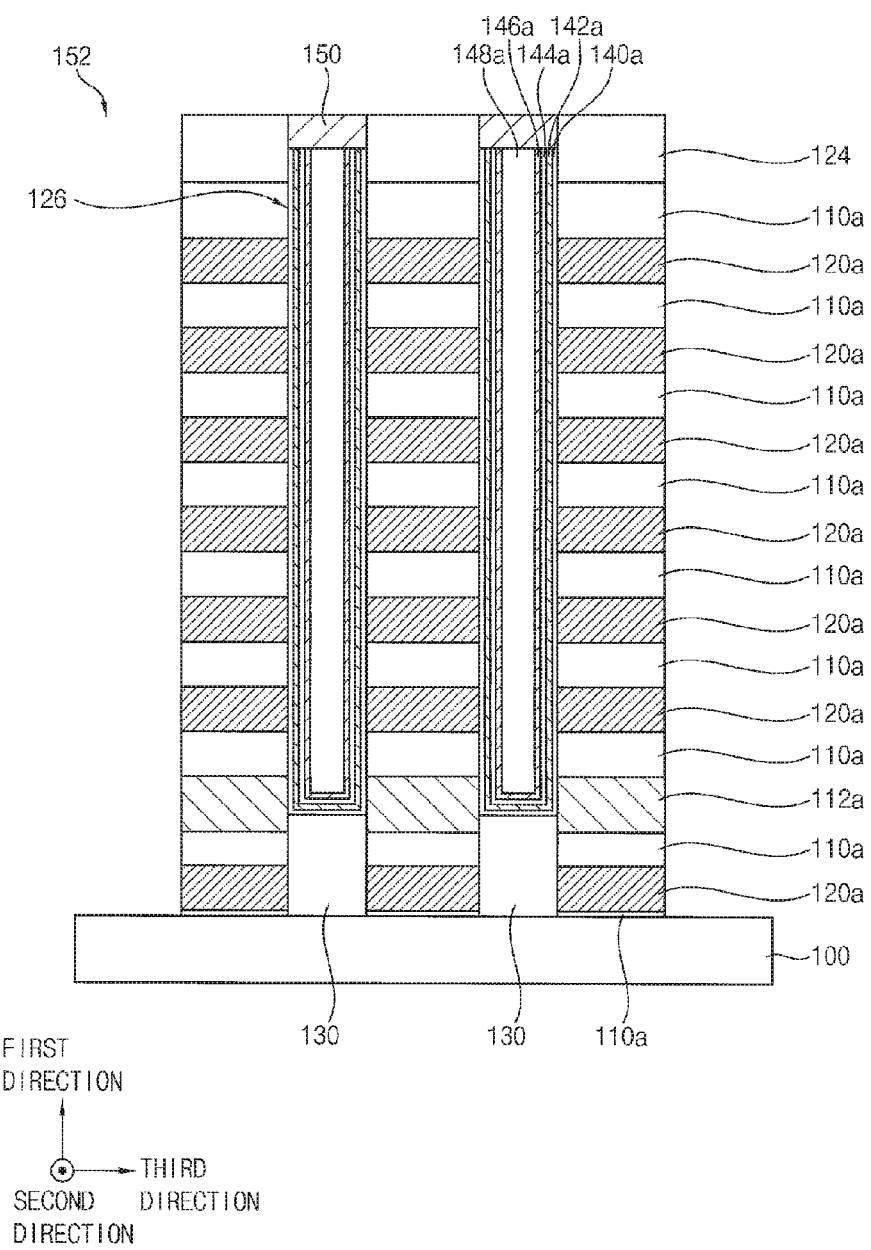

Referring to FIG. 10, the filling insulation layer 148, the channel layer 146, the tunnel insulation layer 144, the charge storage layer 142 and the blocking layer 140 on the upper insulation layer 124 may be removed by an etch back process or a chemical mechanical polishing (CMP) process. The filling insulation layer 148, the channel layer 146, the tunnel insulation layer 144, the charge storage layer 142 and the blocking layer 140 in an upper portion of the hole 126 may be partially removed to form a recess. A pad layer may be formed to fill the recess, and may be planarized to form a pad 150. In example embodiments, the pad 150 may be formed of, e.g., doped polysilicon or undoped polysilicon.

Thus, a first preliminary blocking pattern 140a, a preliminary charge storage pattern 142a, a preliminary tunnel insulation pattern 144a, the channel pattern 146a and a filling insulation pattern 148a may be formed in each of the holes 126. The first preliminary blocking pattern 140a may contact the upper surface of the semiconductor pattern 130.

A first opening 152 may be formed through the upper insulation layer 124, the second mold structure 113, the lower sacrificial layer 112 and the first mold structure 111 to expose a top surface of the substrate 100.

In example embodiments, a hard mask (not shown) may be formed on the upper insulation layer 124 and the pad 150, and the upper insulation layer 124, the second mold structure 113, the lower sacrificial layer 112 and the first mold structure 111 may be anisotropically etched using the hard mask as an etching mask to form the first opening 152.

In example embodiments, the first opening 152 may extend in the second direction, and a plurality of first openings 152 may be formed to be arranged in the third direction. Thus, a first sacrificial pattern 120a, a first insulation pattern 110a and a lower sacrificial pattern 112a may be formed from the first sacrificial layer 120, the first insulation layer 110 and the lower sacrificial layer 112, respectively.

Figure 11:
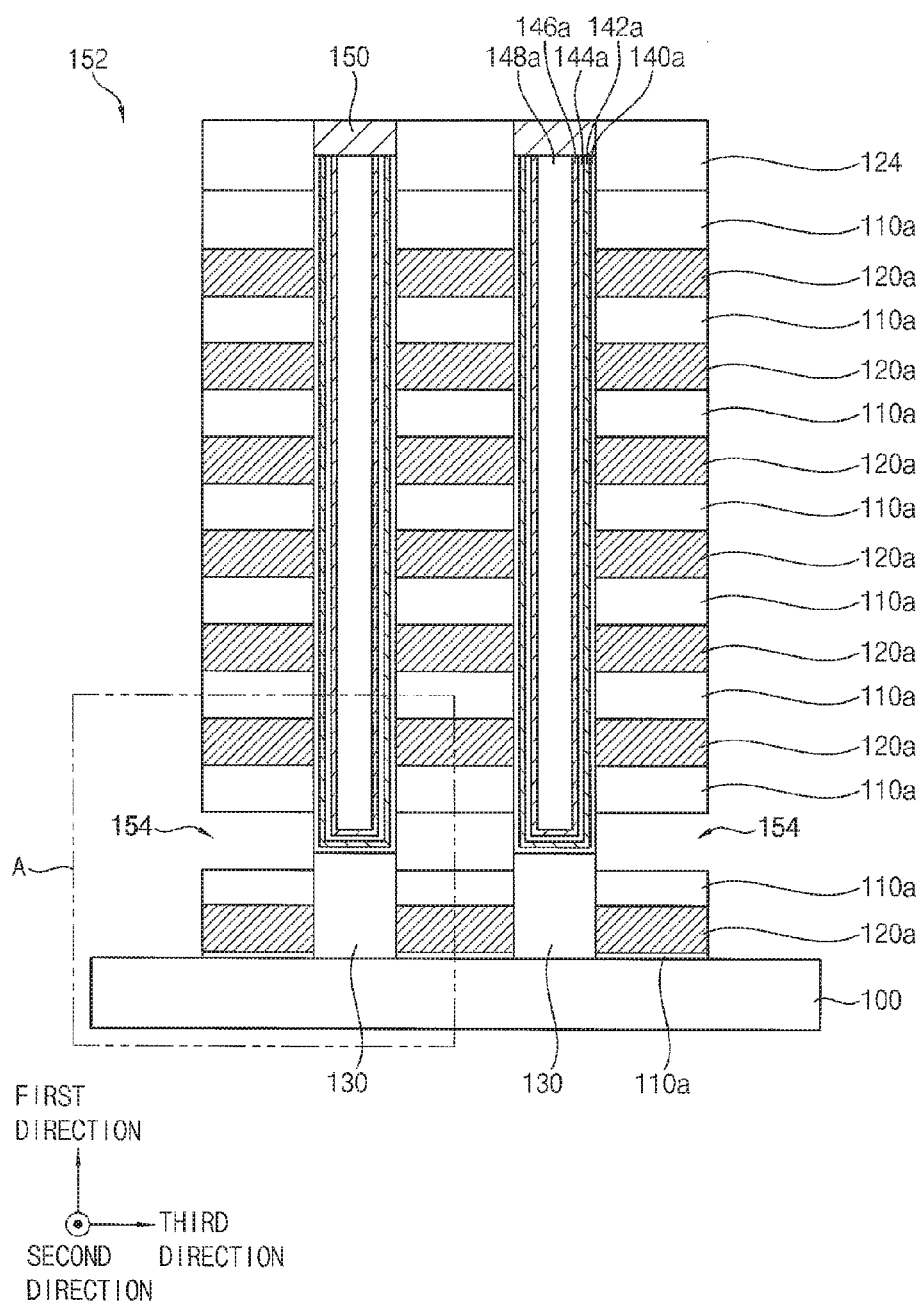

Referring to FIG. 11, the lower sacrificial pattern 112a exposed by a sidewall of the first opening 152 may be selectively etched to form a first gap 154.

The lower sacrificial pattern 112a may be removed by an isotropic etching process, e.g., a wet etching, an isotropic dry etching, etc. When the lower sacrificial pattern 112a includes silicon oxide, the first gap 154 may be formed by the wet etching process using an etchant including hydrofluoric acid. A portion of the first preliminary blocking pattern 140a may be exposed by the first gap 154.

Hereinafter, it will be described with reference to FIGS. 12 to 16, which are enlarged views of the portion "A" of FIG. 1.

Figure 12:
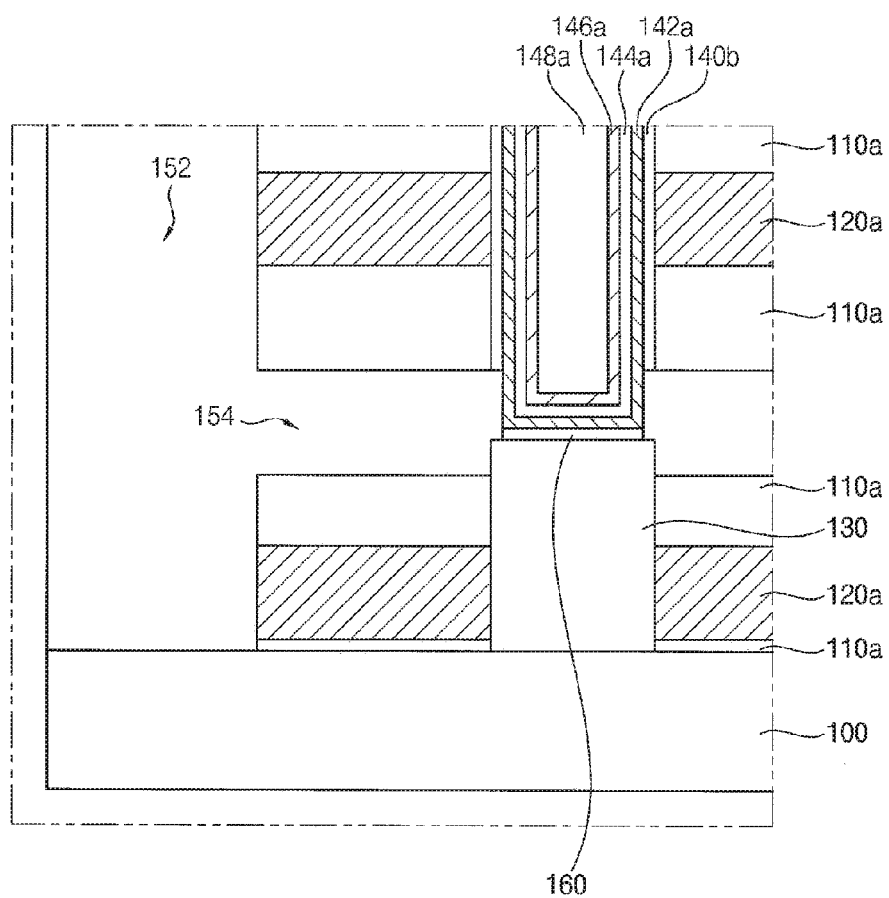

Referring to FIG. 12, the first preliminary blocking pattern 140a exposed by the first gap 154 may be selectively etched by an isotropic etching process, e.g., a wet etching, an isotropic dry etching, etc. In example embodiments, the first preliminary blocking pattern 140a exposed by the first gap 154 may be selectively etched by the wet etching process using an etchant including hydrofluoric acid.

The first preliminary blocking pattern 140a may be separated into a second preliminary blocking pattern 140b extending in the first direction and a first preliminary pattern 160 on the semiconductor pattern 130 by the etching process. A portion of the preliminary charge storage pattern 142a may be exposed by the first gap 154.

During the etching process, a portion of the first insulation pattern 110a exposed by the first gap 154 and a sidewall of the first opening 152 may be etched, so that a width in the first direction of the first gap 154 and a width in the third direction of a portion of the first opening 152 may slightly increase.

Figure 13:
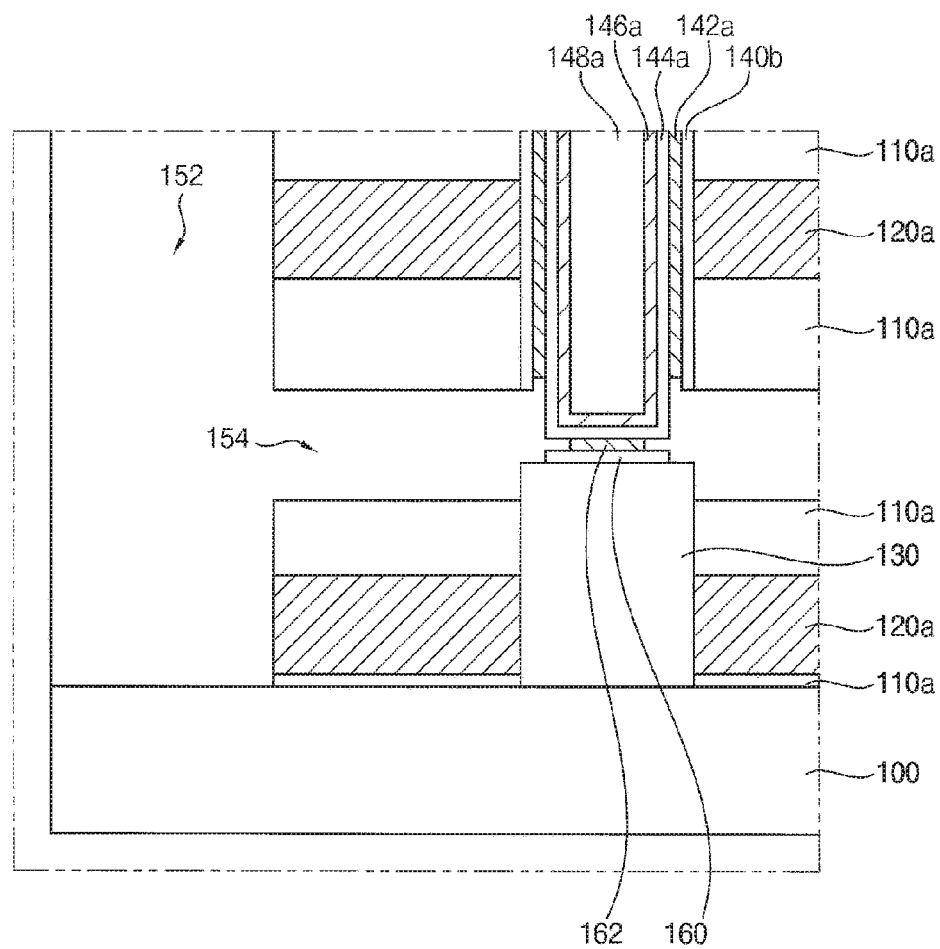

Referring to FIG. 13, the preliminary charge storage pattern 142a exposed by the first gap 154 may be selectively etched by an isotropic etching process, e.g., a wet etching, an isotropic dry etching, etc. In example embodiments, the first preliminary charge storage pattern 142a exposed by the first gap 154 may be selectively etched by the wet etching process using an etchant including sulfuric acid or phosphoric acid.

The first preliminary charge storage pattern 142a may be separated into a charge storage pattern 142b extending in the first direction and a second pattern 162 on the first preliminary pattern 160 by the etching process. A portion of the preliminary tunnel insulation pattern 144a may be exposed by the first gap 154. A width of the second pattern 162 may be smaller than a width of a bottom of the channel pattern 146a.

During the etching process, a portion of the first sacrificial pattern 120a exposed by the first opening 152 may be etched, so that a width in the third direction of a portion of the first opening 152 may slightly increase.

Figure 14:
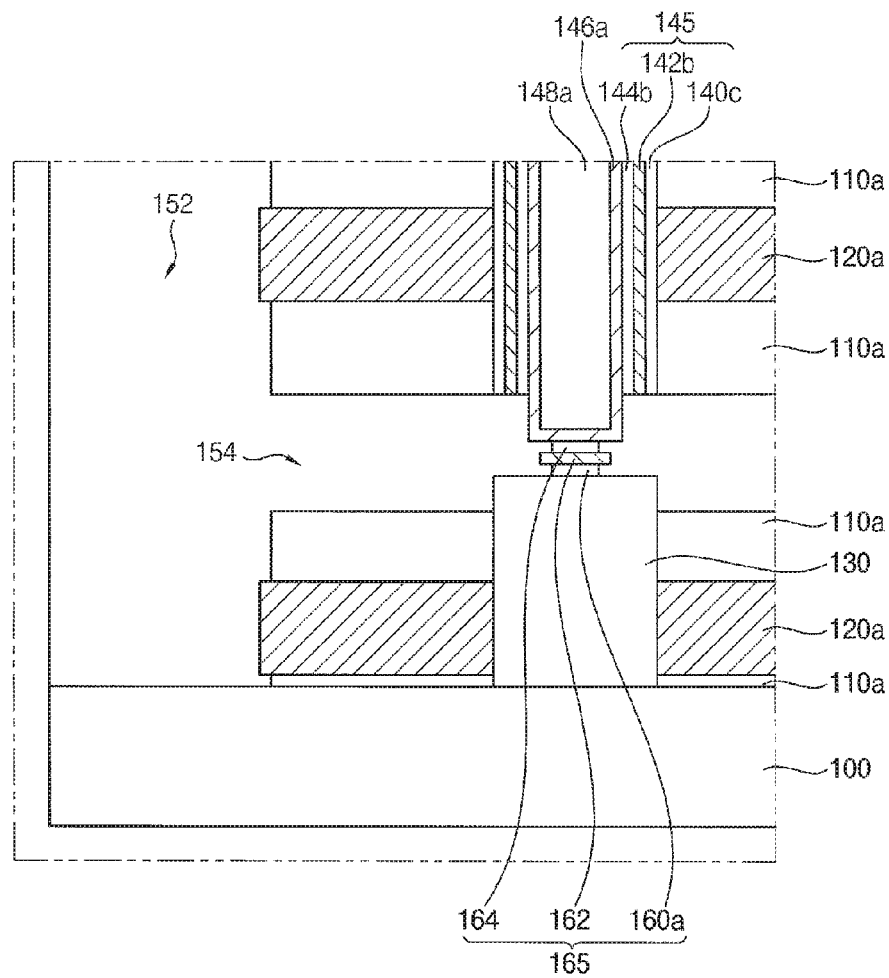

Referring to FIG. 14, a preliminary tunnel insulation pattern 144a exposed by the first gap 154 may be selectively etched by an isotropic etching process, e.g., a wet etching, an isotropic dry etching, etc. In example embodiments, the first preliminary tunnel insulation pattern 144a exposed by the first gap 154 may be selectively etched by the wet etching process using an etchant including hydrofluoric acid.

The preliminary tunnel insulation pattern 144a may be separated into a tunnel insulation pattern 144b extending in the first direction and a third pattern 164 on the second pattern 162 by the etching process. A width of the third pattern 164 may be smaller than a width of the bottom of the channel pattern 146a, so that the bottom of the channel pattern 146a may cover an upper surface of the third pattern 164.

During the etching process, the second preliminary blocking pattern 140b and the first preliminary pattern 160 may be partially etched to form a first blocking pattern 140c and a first pattern 160a, respectively. A width of the first pattern 160a may be smaller than the width of the bottom of the channel pattern 146a.

Thus, an insulation structure 165 including the first, second and third patterns 160a, 162 and 164 sequentially stacked may be formed on the semiconductor pattern 130. The insulation structure 165 may be formed under the channel pattern 146a to support the channel pattern 146a, and may have a pillar shape.

In example embodiments, a sidewall of the insulation structure 165 may be uneven along the first direction, and may have concave and convex portions. That is, at least one of the first, second and third patterns 160a, 162 and 164 may protrude from the others in a lateral direction. For example, the second pattern 162 may protrude from the first and third patterns 160a, 162 and 164 in the lateral direction.

In example embodiments, a sidewall of the insulation structure 165 may not be uneven. That is, the first, second and third patterns 160a, 162 and 164 may not protrude from the others in a lateral direction.

During the etching process, the first insulation pattern 110a exposed by the first gap 154 and a sidewall of the first insulation pattern 110a exposed by the first opening 152 may be partially etched, so that a width in the first direction of the first gap 154 and a width in the third direction of the first opening 152 may slightly increase.

Figure 15:
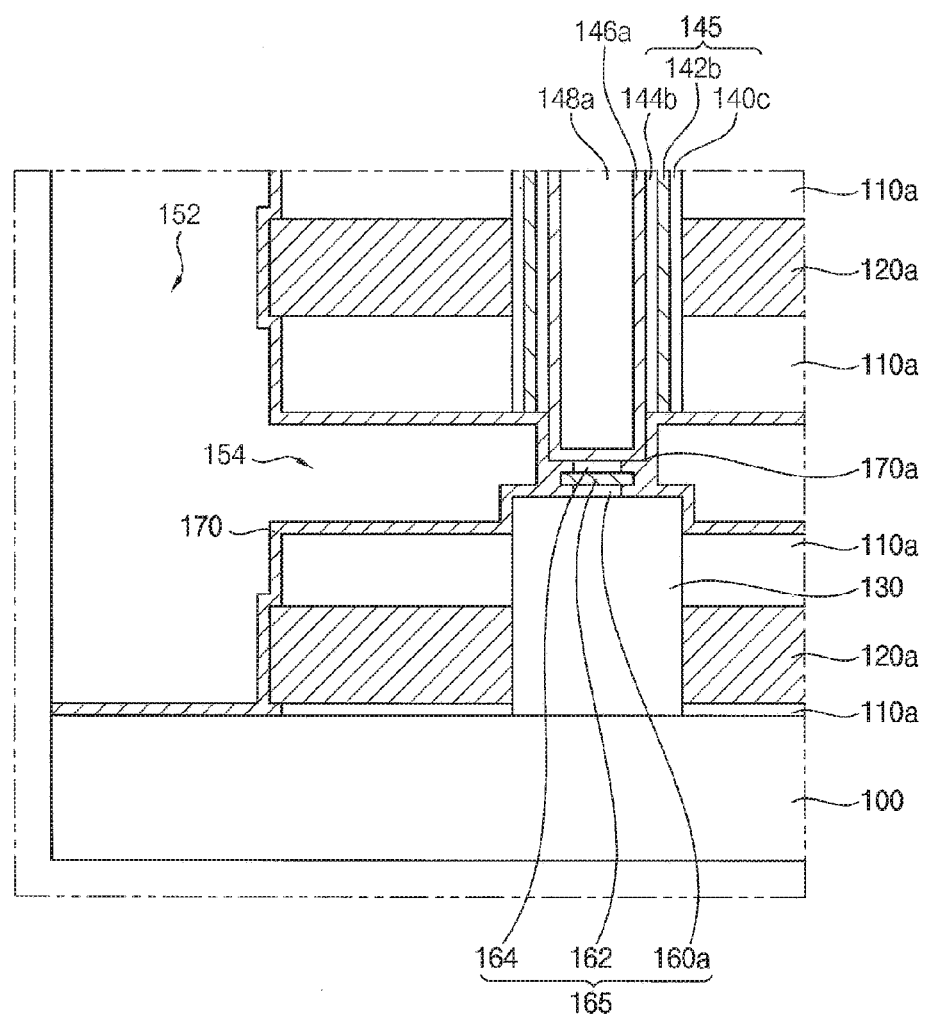

Referring to FIG. 15, a conductive layer 170 may be conformally formed on a sidewall and a bottom of the first opening 152, an inner wall of the gap 154, the upper insulation layer 124 (refer to FIG. 11) and an upper surface of the pad 150 (refer to FIG. 11). The conductive layer 170 may include doped polysilicon or undoped polysilicon. The conductive layer 170 may be formed by an ALD process or a CVD process.

The conductive layer 170 may cover a sidewall of the insulation structure 165. The conductive layer 170 may sufficiently fill a groove defined by a bottom of the channel pattern 146a, a sidewall of the insulation structure 165 and the upper surface of the semiconductor pattern 130. The groove may have a bended shape.

In example embodiments, the conductive layer 170 on the sidewall and the bottom of the first opening 152 may have a first thickness. However, the conductive layer 170 filling the groove may have a second thickness greater than the first thickness.

Figure 16:
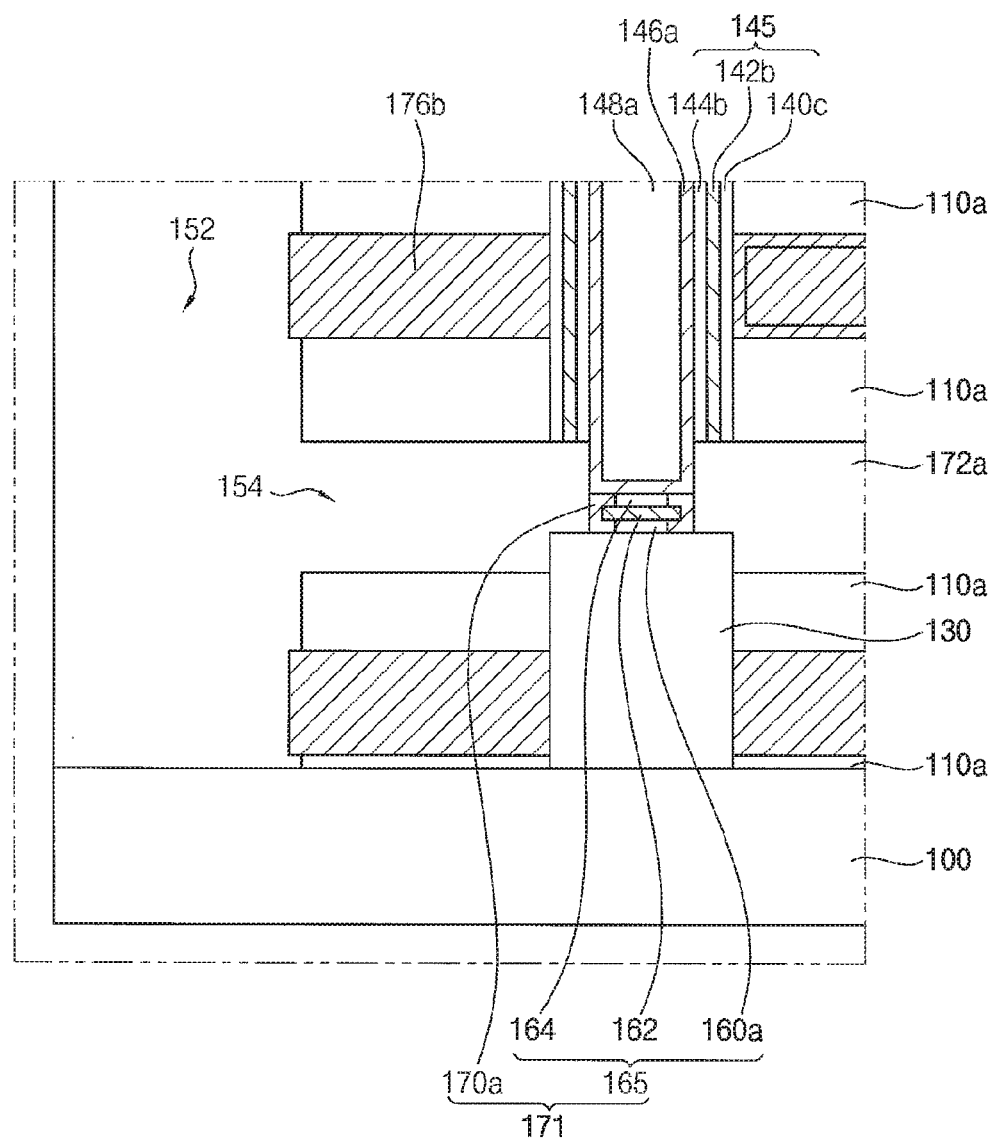

Referring to FIG. 16, the conductive layer 170 on the sidewall and the bottom of the first opening 152, the inner wall of the first gap 154, the upper insulation layer 124 (refer to FIG. 11) and the pad 150 (refer to FIG. 11) may be isotropically etched by e.g., a wet etching process or an isotropic dry etching process, and a portion of the conductive layer 170 in the groove may remain to form a conductive pattern 170a. In example embodiments, the conductive layer 170 may be removed by the amount of the first thickness through the isotropic etching process.

The conductive pattern 170a may cover a sidewall of the insulation structure 165. The conductive pattern 170a may contact a bottom edge of the channel pattern 146a and the upper surface of the semiconductor pattern 130, and may have a hollow cylindrical shape. Thus, the semiconductor pattern 130 and the channel pattern 146a may be electrically connected with each other by the conductive pattern 170a. That is, a connection structure 171 including the insulation structure 165 and the conductive pattern 170a may be formed between the semiconductor pattern 130 and the channel pattern 146a. The semiconductor pattern 130 and the channel pattern 146a may be spaced apart from each other in the first direction.

In example embodiments, the conductive pattern 170a may be conformally formed in the groove, on the sidewall of the channel pattern 146a, and on the first gap 154 by the isotropic etching process, as shown in FIG. 6.

Figure 17:
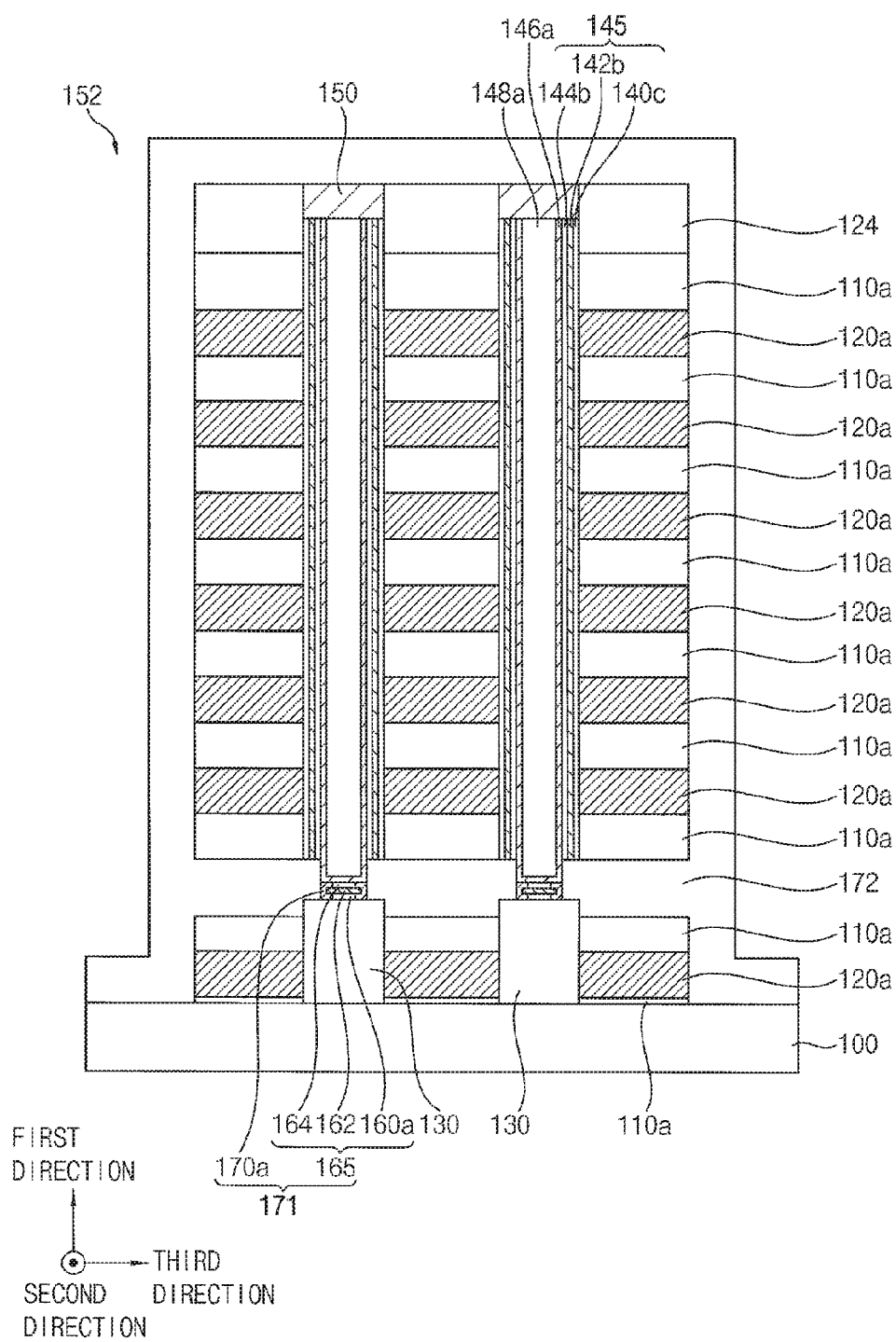

Referring to FIG. 17, a second insulation layer 172 may be formed on the sidewall and the bottom of the first opening 152, the upper insulation layer 124 to fill the first gap 154. The second insulation layer 172 may include silicon oxide. In example embodiments, the second insulation layer 172 may be formed of a material the same as or substantially the same as a material of the first insulation pattern 110a.

The second insulation layer 172 may be formed by an ALD process or a CVD process.

Figure 18:
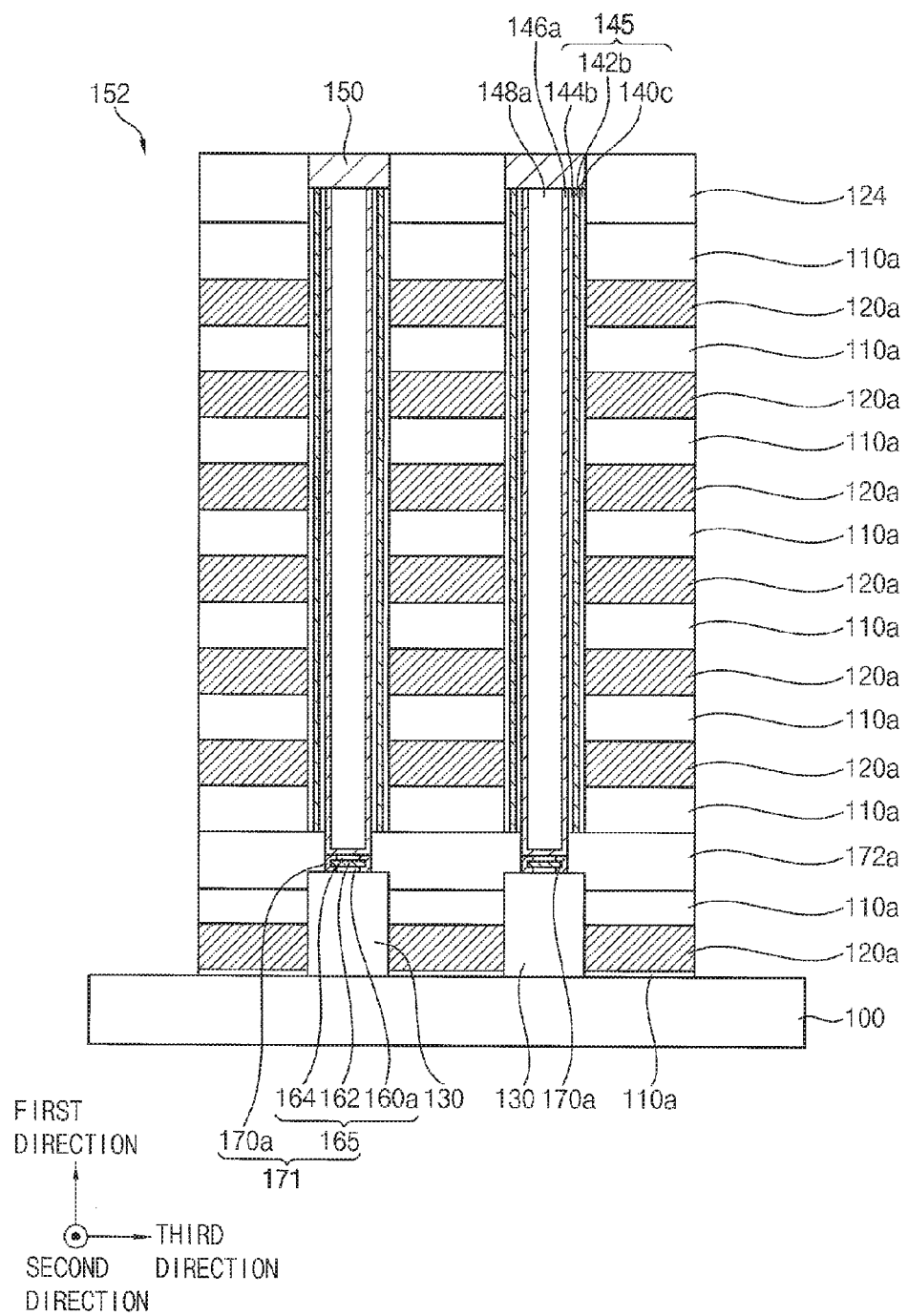

Referring to FIG. 18, the second insulation layer 172 on the sidewall and the bottom of the first opening 152, the upper insulation layer 124 and the pad 150 may be isotropically etched by e.g., a wet etching process or an isotropic dry etching process. Thus, a second insulation pattern 172*a* may be formed in the first gap 154.

Figure 19:
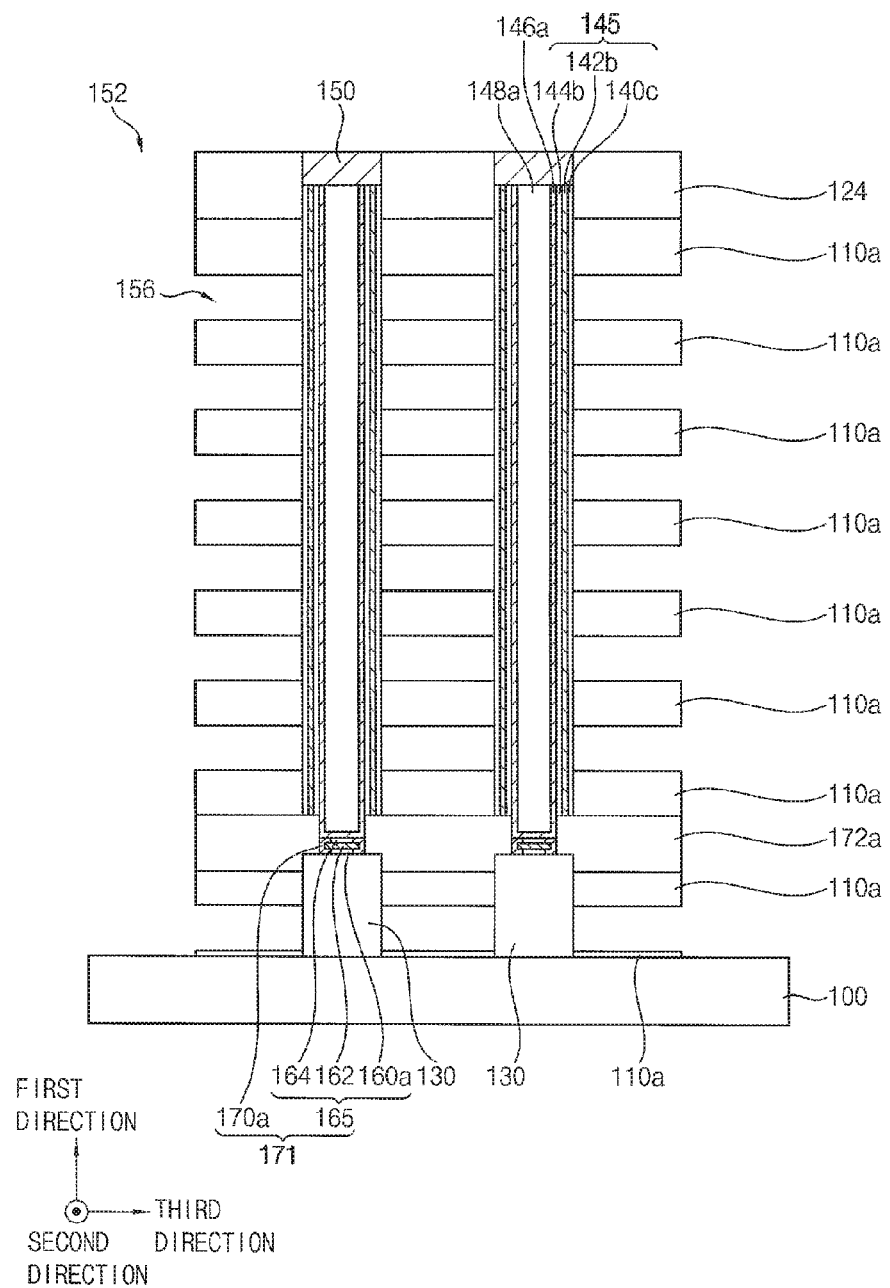

Referring to FIG. 19, the first sacrificial pattern 120*a* may be removed to form a second gap 156. Sidewalls of the first blocking pattern 140*c* and the semiconductor pattern 130 may be partially exposed by the second gap 156. In example embodiments, the first sacrificial pattern 120*a* may be isotropically etched by, e.g., a wet etching process or an isotropic dry etching process. For example, the first sacrificial pattern 120*a* exposed by the first opening 152 may be removed by the wet etching process using an etchant including sulfuric acid or phosphoric acid.

Figure 20:
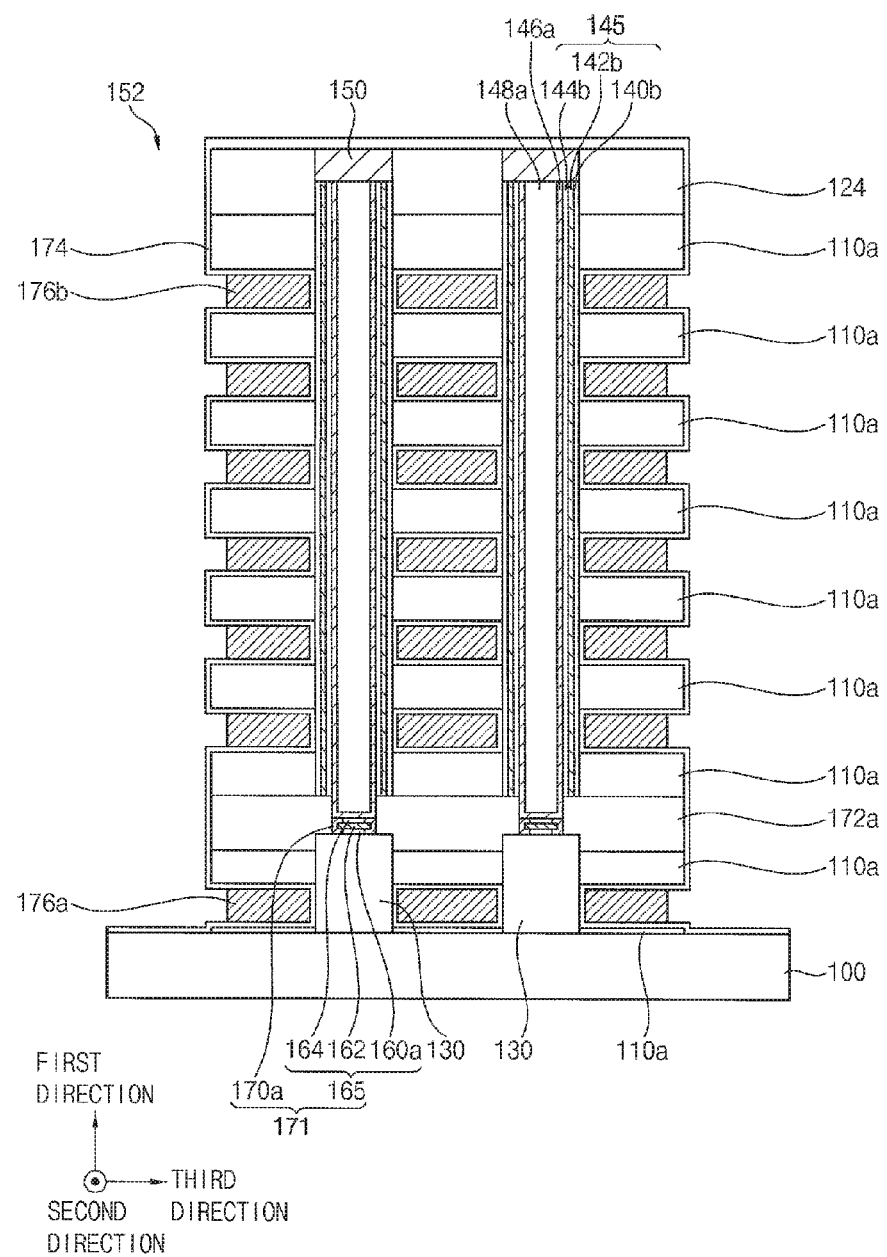

Referring to FIG. 20, a second blocking layer 174 may be formed on the sidewall of the first blocking pattern 140*c*, the sidewall of the semiconductor pattern 130, an inner wall of the second gap 156, the first insulation pattern 110*a*, the upper insulation layer 124, the pad 150 and the substrate 100. A first gate 176*a* and second gates 176*b* may be formed on the second blocking layer 174 to fill the second gaps 156, respectively.

In example embodiments, the second blocking layer 174 may be formed of a metal oxide, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

In order to form the first and second gates 176*a* and 176*b*, a gate electrode layer may be formed on the second blocking layer 174 to fill the second gap 156. The gate electrode layer may be formed of a metal and/or a metal nitride. In example embodiments, the gate electrode layer may be formed of a metal having a low electric resistance, e.g., tungsten, titanium, tantalum, platinum, etc., and a metal nitride, e.g., titanium nitride, tantalum nitride, etc. The gate electrode layer may be partially etched to form the first and second gates 176*a* and 176*b* in the second gaps 156, respectively. In example embodiments, the first electrode layer may be partially etched by a wet etching process.

The first gate 176*a* may be formed on the sidewall of the semiconductor pattern 130, and may serve as a GSL. The second gates 176*b* may be formed on the sidewall of the channel pattern 146*a*, and may serve as word lines or SSLs.

In example embodiments, each of the first and second gates 176*a* and 176*b* may partially fill the second gap 156. Thus, the sidewall of the first opening 152 may be uneven along the first direction due to the first and second gates 176*a* and 176*b*. In example embodiments, each of the first and second gates 176*a* and 176*b* may sufficiently fill the second gap 156.

Figure 21:
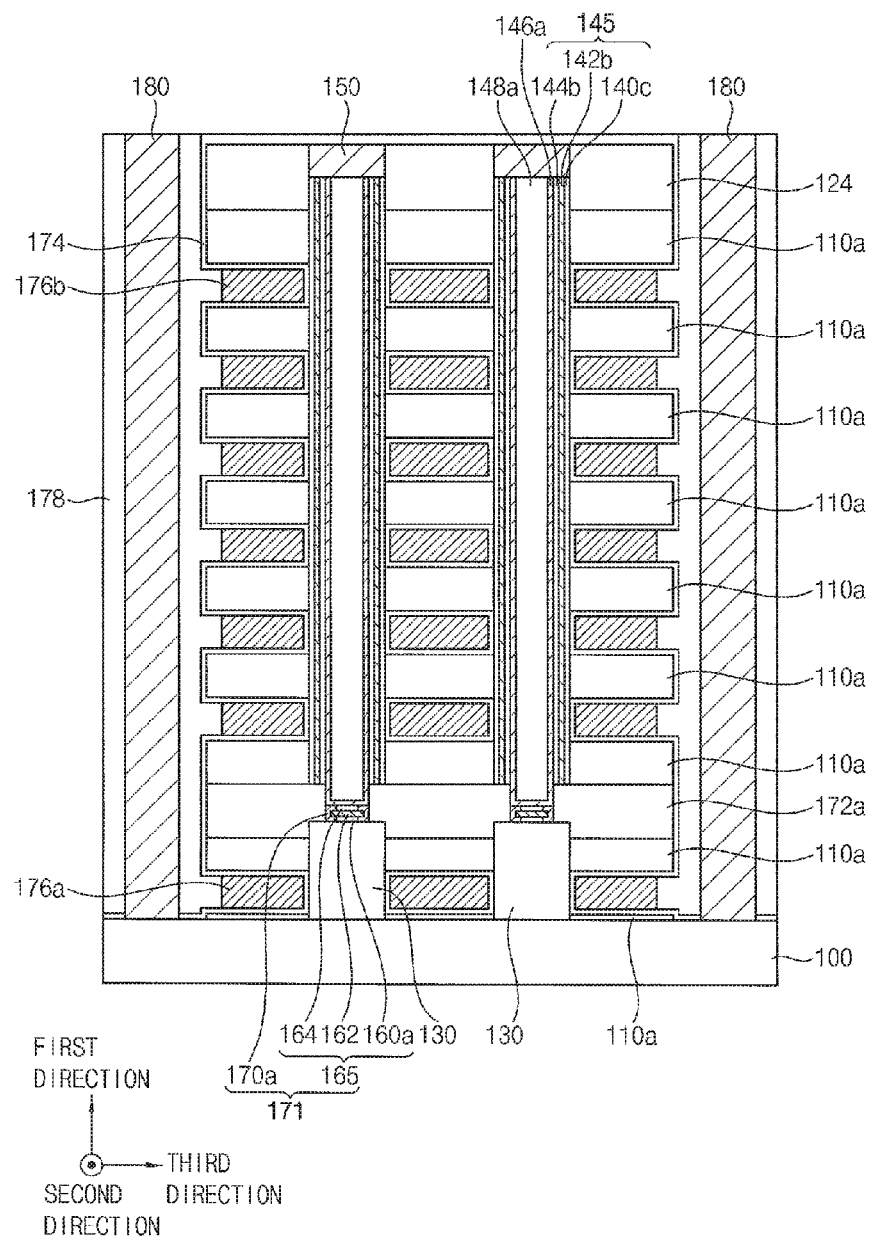

Referring to FIG. 21, a third insulation layer may be formed on the second blocking layer 174 along the bottom and the sidewall of the first opening 152. The third insulation layer on the bottom of the first opening 152 may be anisotropically etched to form a third insulation pattern 178 exposing the top surface of the substrate 100. Also, the first opening 152 may be transformed to a second opening (not shown) by the third insulation pattern 178. Impurities may be doped into the substrate 100 exposed by the second opening, so that an impurity region may be formed. A conductive pattern 180 may be formed to fill the second opening. The conductive pattern 180 may serve as a CSL.

Particularly, a conductive layer may be formed to fill the second opening, and may be planarized until a top surface of the second blocking layer 174 may be exposed to form a conductive pattern 179. The conductive layer may be formed of a metal and/or a metal nitride. In example embodiments, the conductive layer may include a metal having a low resistance, e.g., tungsten, titanium, tantalum, platinum, etc, and/or a metal nitride, e.g., titanium nitride, tantalum nitride, etc.

A bit line contact (not shown) and a bit line (not shown) may be formed on the pad 150, and may be electrically connected to the pad 150. Thus, the vertical semiconductor device may be manufactured.

FIG. 22 is a vertical cross-sectional view illustrating a vertical memory device in accordance with example embodiments, and FIG. 23 is an enlarged cross-sectional view of a portion "C" of the vertical memory device semiconductor in FIG. 22. The vertical memory device may be the same as or substantially the same as the vertical memory device of FIGS. 1, 2A, 2B and 3, except for the semiconductor pattern.

Referring to FIGS. 22 and 23, a channel pattern 146*a* may be formed to be spaced apart from a substrate 100 in the first direction. A connection structure 211 may be formed between the substrate 100 and a channel pattern 146*a*, and may be electrically connected to the substrate 100 and the channel pattern 146*a*. A plurality of gates 232 may surround the channel pattern 146*a*, and may extend in the second direction. A data storage structure 145 including a tunnel insulation pattern 144*b*, a charge storage pattern 142*b* and a first blocking pattern 140*c* may be formed between the channel pattern 146*a* and the gate 232. The tunnel insulation pattern 144*b*, the charge storage pattern 142*b* and the first blocking pattern 140*c* may be sequentially stacked on the channel pattern 146*a*.

The channel pattern 146*a* may be the same as or substantially the same as the channel pattern illustrated with reference to FIGS. 1, 2A, 2B and 3. However, no semiconductor pattern may be formed under the channel pattern 146*a*, so that a bottom of the channel pattern 146*a* may be substantially flat. A filling insulation pattern 148*a* may be formed on the channel pattern 146*a* to fill an inner space formed by the channel pattern 146*a*.

The data storage structure 145 may cover the sidewall of the channel pattern 146*a*. The data storage structure 145 may be the same as or substantially the same as the data storage structure illustrated with reference to FIGS. 1, 2A, 2B and 3.

The connection structure 211 may be formed between the substrate 100 and the channel pattern 146*a* in the first direction.

The connection structure 211 may include a conductive pattern 210 and an insulation structure 205. The conductive pattern 210 may have a hollow cylindrical shape, and may contact a bottom edge of the channel pattern 146*a* and the substrate 100. The insulation structure 205 may contact an inner sidewall of the conductive pattern 210, a central bottom of the channel pattern 146*a* and the substrate 100. This, the connection structure 211 may have a pillar shape.

The substrate 100 and the channel pattern 146*a* may be electrically connected to each other via the conductive pattern 210.

The insulation structure 205 may include materials the same as or substantially the same as materials included in the data storage structure 145. In example embodiments, the insulation structure 205 may include a first pattern 200*a* including the same material as that of the first blocking pattern 140*c*, a second pattern 202 including the same material as that of the charge storage pattern 142*b*, and a third pattern 204 including the same material as that of the tunnel insulation pattern 144*b*, and the first, second and third patterns 200*a*, 202 and 204 may be sequentially stacked.

A sidewall of the insulation structure 205 may be uneven along the first direction, and may have concave and convex portions. That is, at least one of the first, second and third patterns 200a, 202 and 204 may protrude from the others in a lateral direction. For example, the first and third patterns 200a and 204 may protrude from the second pattern 202 in the lateral direction. Alternatively, the second pattern 202 may protrude from the first and third patterns 200a and 204 in the lateral direction, as shown in FIG. 1, where the second pattern 162 protrudes from the first and third patterns 160a and 164.

The first to third channel patterns 200a, 202 and 204 may not protrude from a bottom edge of the channel pattern 146a in the lateral direction. That is, a width of each of the first, second and third pattern 200a, 202 and 204 may be smaller than a width of the bottom of the channel pattern 146a.

The conductive pattern 210 may fill a recess defined by the sidewall of the insulation structure 205, the top surface of the substrate 100 and the bottom of the channel pattern 146a.

Each of the gates 232 may serve as a GSL, a word line, or a SSL. In example embodiments, at least one gate 232 at a lowermost level may serve as the GSL, and at least one gate 232 at an uppermost level may serve as the SSL. Ones of the gates 232 between the GSL and SSL may serve as the word lines.

A second blocking layer 230 covering sidewalls and a bottom of the gate 232 may be further formed.

A plurality of insulation patterns 110a and 220 may be formed between the substrate 100 and the gate 232 at the lowermost level and between neighboring ones of the gates 232.

In example embodiments, a plurality of first insulation patterns 110a may be formed between the gates 232, respectively. A stacked structure including a second insulation pattern 220 and a first insulation pattern 110a may be formed between the substrate 100 and the gate 232 at the lowermost level. After forming the first insulation patterns 110a, the second insulation pattern 220 may be formed by a deposition process. However, the second insulation pattern 220 may include a material the same as or substantially the same as a material of the first insulation patterns 110a. The first and second insulation patterns 110a and 220 may include, e.g., silicon oxide.

A first distance in the first direction between the substrate 100 and the gate 232 at the lowermost level may be greater than a second distance in the first direction between the gates 232.

A third insulation pattern 240 and a conductive pattern 242 may be further formed, and may be the same as or substantially the same as or similar to the third insulation pattern and the conductive pattern, respectively, illustrated with reference to FIGS. 1, 2A, 2B and 3.

A bit line contact (not shown) and a bit line (not shown) may be further formed on the pad 150, and the bit line contact and the bit line may be electrically connected to the pad 150.

Figure 26:
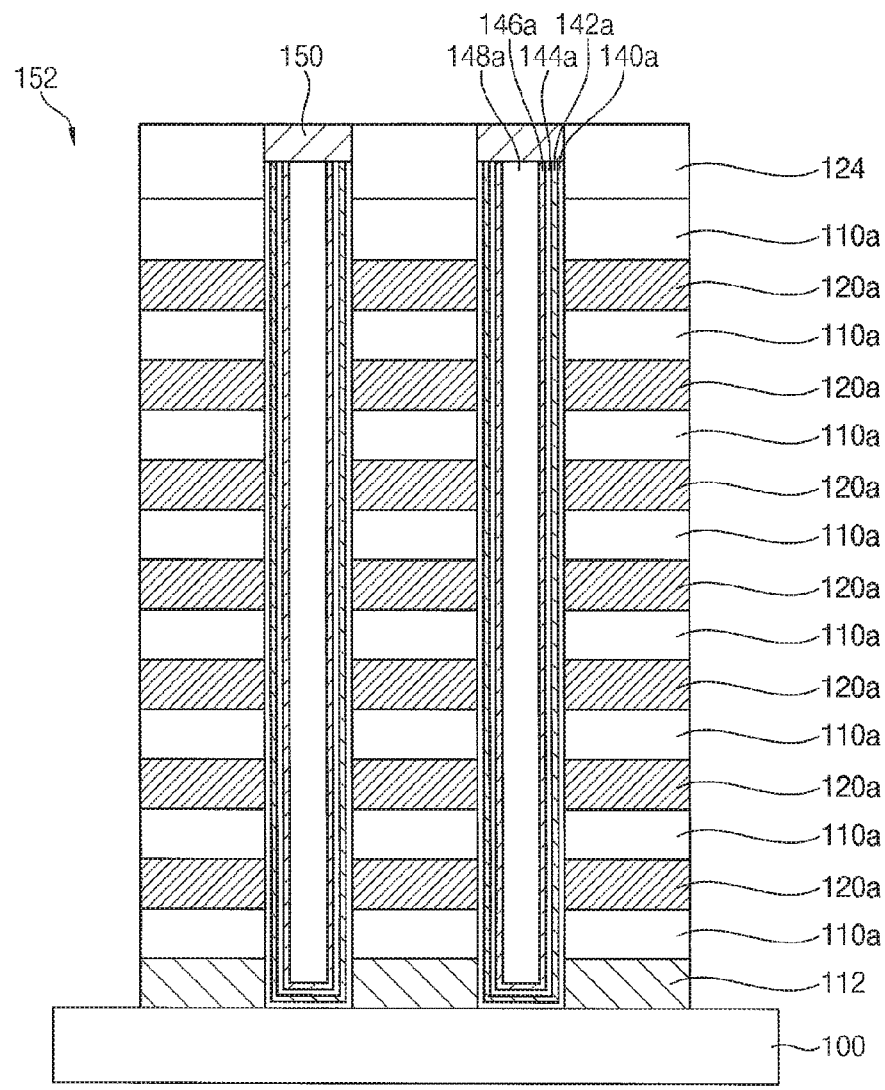
Figure 27:
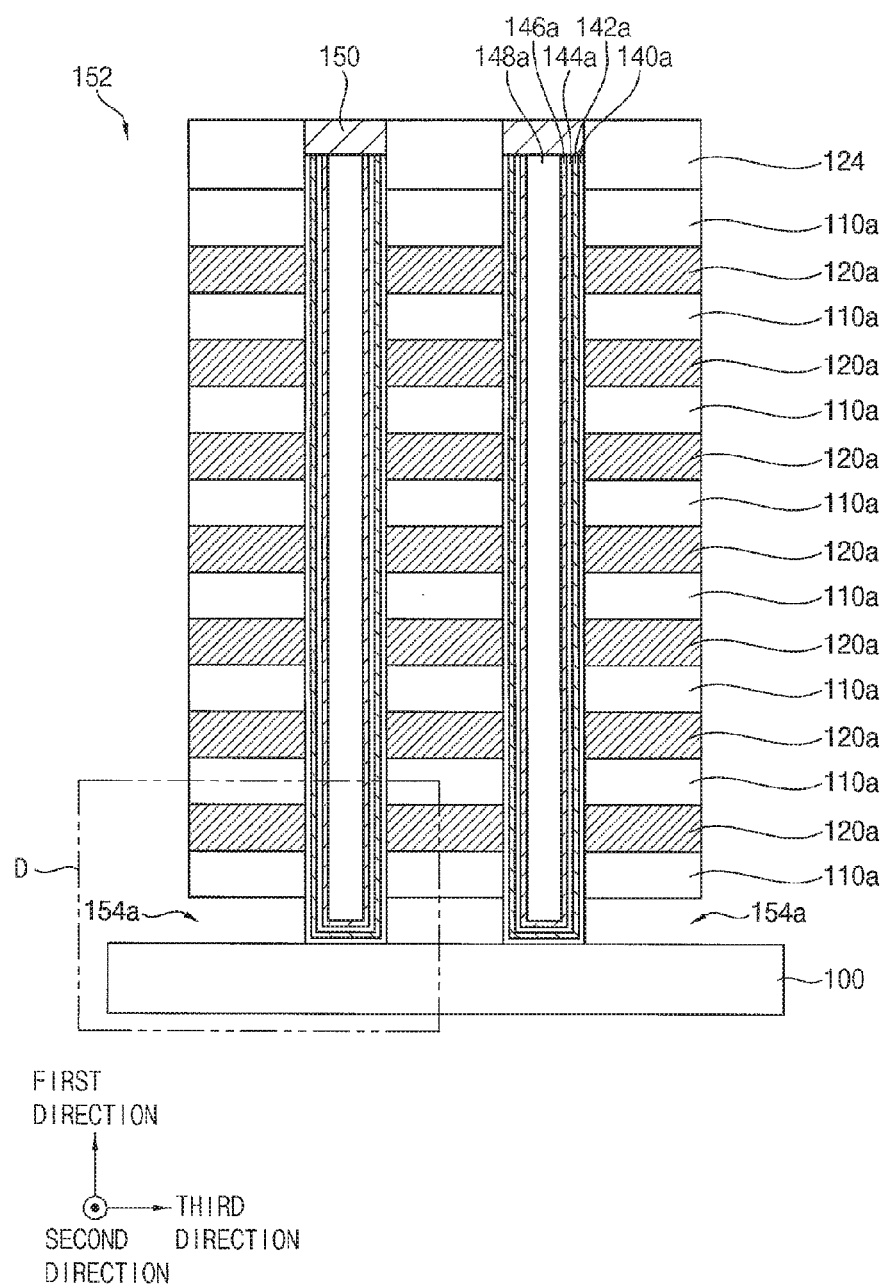
Figure 28:
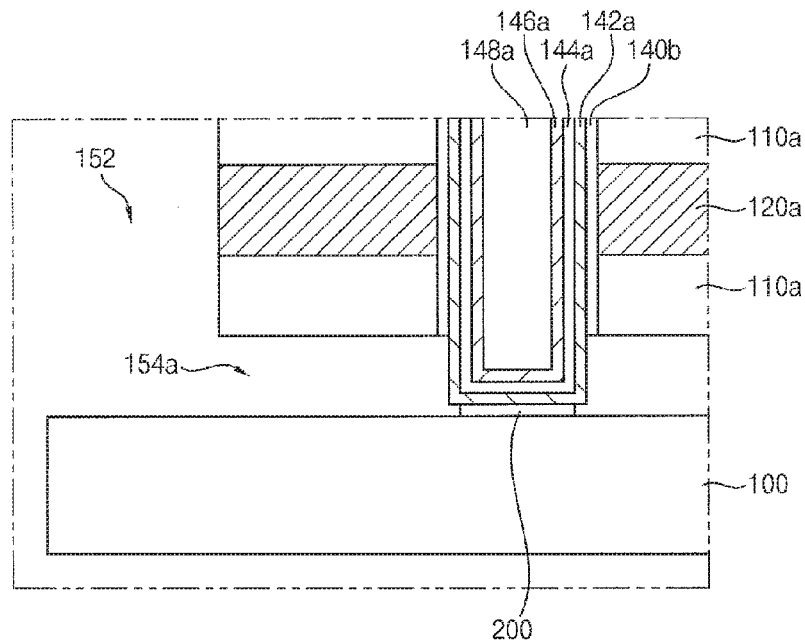
Figure 29:
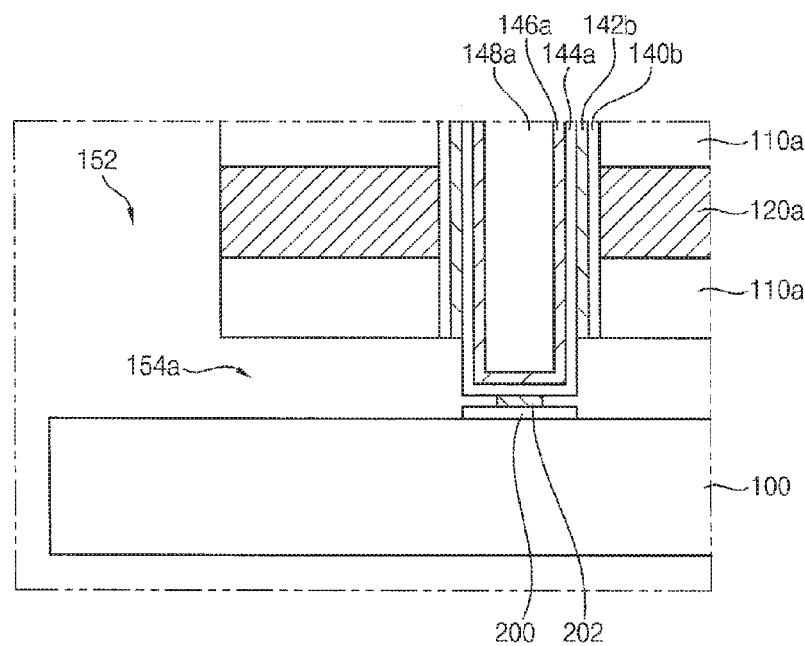
Figure 30:
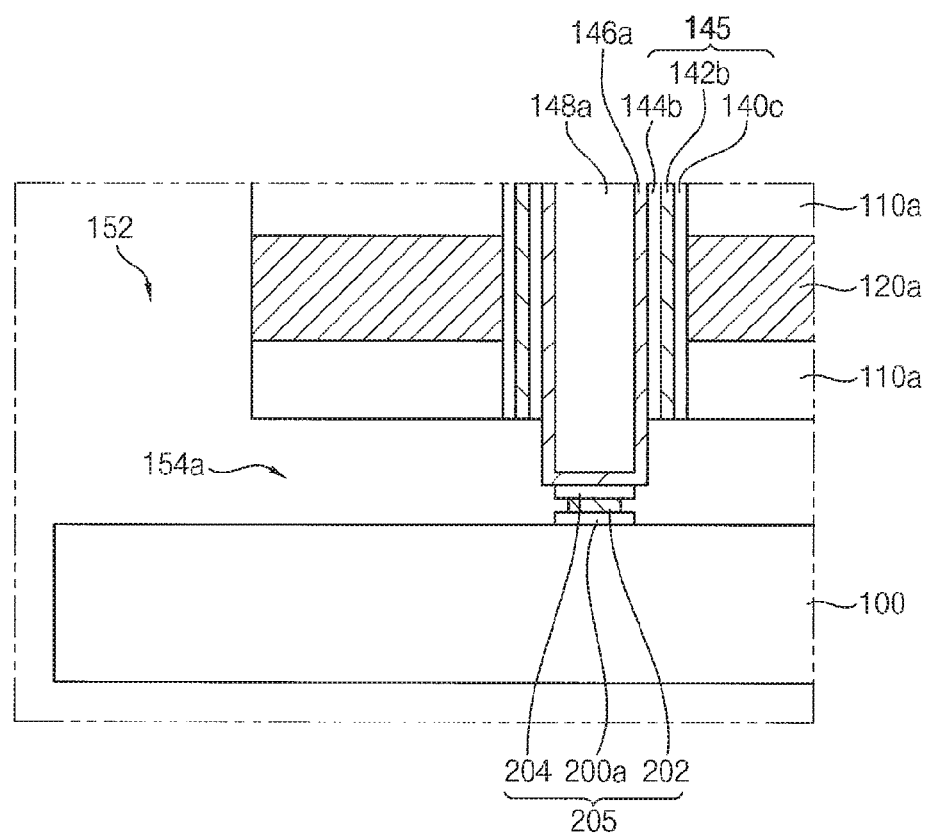

FIGS. 24 to 31 are cross-sectional views illustrating a method of manufacturing a semiconductor device in accordance with example embodiments. Particularly, FIGS. 28 to 30 are enlarged cross-sectional views.

Referring to FIG. 24, a lower sacrificial layer 112 may be formed on a substrate 100. A first insulation layer 110 and a first sacrificial layer 120 may be alternately and repeatedly formed on the lower sacrificial layer 112, and so that a mold structure may be formed.

The lower sacrificial layer 112 may be formed directly on the substrate 100.

The lower sacrificial layer 112 may include a material having an etching selectivity with respect to the mold structure and a channel pattern subsequently formed. That is, the lower sacrificial layer 112 may include a material having an etching selectivity with respect to oxide and nitride in the mold structure and silicon included in the channel pattern subsequently formed.

In example embodiments, the lower sacrificial layer 112 may be formed of silicon oxide having an etch rate higher than an etch rate of the first insulation layer 110. In example embodiments, when the substrate 100 includes single crystalline silicon, the lower sacrificial layer 112 may be formed of silicon germanium. Alternatively, the lower sacrificial layer 112 may be formed of a material the same as or substantially the same as or similar to a material of the lower sacrificial layer illustrated with reference to FIG. 7.

In example embodiments, the lower sacrificial layer 112 may be formed to have a thickness greater than a sum of thicknesses of a blocking layer, a charge storage layer, a tunnel insulation layer and a channel layer subsequently formed.

The number of the first sacrificial layers 120 in the mold structure may be the same as or substantially the same as the number of gates in a cell string.

In example embodiments, the first insulation layer 110 may be formed of, e.g., silicon oxide. In example embodiments, the first sacrificial layer 120 may be formed of a material having an etching selectivity with respect to the first insulation layer 110. For example, the first sacrificial layer 120 may be formed of, e.g., silicon nitride.

Figure 25:
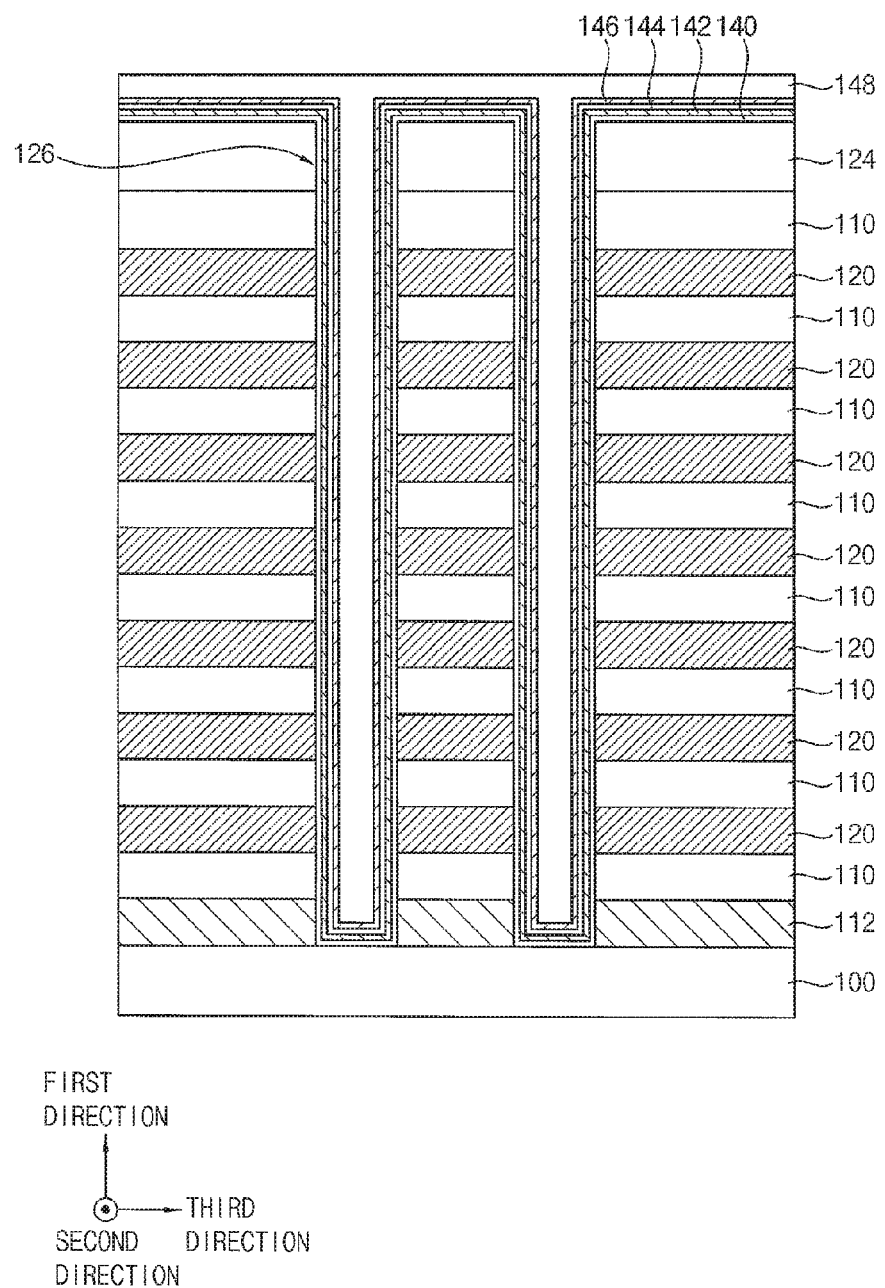

Referring to FIG. 25, an upper insulation layer 124 may be formed on the mold structure. A plurality of holes 126 may be formed through the upper insulation layer 124, the first insulation layer 110, the first sacrificial layer 120 and the lower sacrificial layer 112 to expose a top surface of the substrate 100. During an etching process for forming the holes 126, preferably, the top surface of the substrate 100 may not be over-etched. A blocking layer 140, a charge storage layer 142, a tunnel insulation layer 144 and a channel layer 146 may be sequentially formed on inner walls of the holes 126, the top surface of the substrate 100 and an upper surface of the upper insulation layer 124. A filling insulation layer 148 may be formed on the channel layer 146 to fill each of the holes 126.

Processes may be the same as or substantially the same as or similar to the processes illustrated with reference to FIGS. 8 and 9 may be performed. However, after forming the holes 126, no semiconductor pattern may be formed in each of the holes 126.

Referring to FIG. 26, the filling insulation layer 148, the channel layer 146, the tunnel insulation layer 144, the charge storage layer 142 and the blocking layer 140 on the upper insulation layer 124 may be removed. The filling insulation layer 148, the channel layer 146, the tunnel insulation layer 144, the charge storage layer 142 and the blocking layer 140 formed in an upper portion of the holes 126 may be partially removed to form a recess. A pad layer may be formed to fill the recess, and planarized until the upper surface of the upper insulation may be exposed to form a pad 150.

Thus, a first preliminary blocking pattern 140a, a preliminary charge storage pattern 142a, a preliminary tunnel insulation pattern 144a, a channel pattern 146a and a filling insulation pattern 148a may be formed in each of the holes 126. The first preliminary blocking pattern 140a may contact the top surface of the substrate 100.

A first opening 152 may be formed through the upper insulation layer 124, the mold structure and the lower sacrificial layer 112 to expose a top surface of the substrate 100.

Processes may be the same as or substantially the same as or similar to the processes illustrated with reference to FIG. 10 may be performed.

Referring to FIG. 27, the lower sacrificial pattern 112a exposed by a sidewall of the first opening 152 may be selectively removed to form a first gap 154a.

The lower sacrificial pattern 112a may be removed by an isotropic etching process, e.g., wet etching, isotropic dry etching, etc. When the lower sacrificial pattern 112a includes silicon oxide, the first gap 154a may be formed by the wet etching process using an etchant including hydrofluoric acid. Portions of the first preliminary blocking pattern 140a and the substrate 100 may be exposed by the first gap 154a.

Hereinafter, it will be described with reference to FIGS. 28 to 30, which are enlarged views of a portion "D" of FIG. 27.

Referring to FIG. 28, the first preliminary blocking pattern 140a exposed by the first gap 154a may be selectively etched by an isotropic etching process, e.g., a wet etching, an isotropic dry etching, etc.

When the etching process is performed, the first preliminary blocking pattern 140a may be divided into a second preliminary blocking layer 140b extending in the first direction and a first preliminary pattern 200 on the substrate 100. The preliminary charge storage pattern 142a may be partially exposed by the first gap 154a.

Referring to FIG. 29, the preliminary charge storage pattern 142a exposed by the first gap 154a may be partially etched by anisotropic etching process, e.g., a wet etching, an isotropic dry etching, etc.

Thus, the preliminary charge storage pattern 142a may be divided into a charge storage pattern 142b extending in the first direction and a second pattern 202 on the first preliminary pattern 200. A width of the second pattern 202 may be controlled by the etching process. The preliminary tunnel insulation pattern 144a may be partially exposed by the first gap 154a.

Referring to FIG. 30, the preliminary tunnel insulation pattern 144a exposed by the first gap 154a may be selectively etched by anisotropic etching process, e.g., a wet etching, an isotropic dry etching, etc.

Thus, the preliminary tunnel insulation pattern 144a may be divided into a tunnel insulation pattern 144b extending in the first direction and a third pattern 204 on the second pattern 202. The channel pattern 146a may be partially exposed by the first gap 154a.

During the etching process, the second preliminary blocking pattern 140b and the first preliminary pattern 200 may be partially etched to form a first blocking pattern 140c and a first pattern 200a, respectively.

Thus, an insulation structure 205 including the first, second and third patterns 200a, 202 and 204 sequentially stacked may be formed on the substrate 100. The insulation structure 205 may be formed under the channel pattern 146a to support the channel pattern 146a, and may have a pillar shape.

In example embodiments, a sidewall of the insulation structure 205 may be uneven along the first direction, and may have concave and convex portions. That is, at least one of the first, second and third patterns 200a, 202 and 204 may protrude from the others in a lateral direction.

Figure 31:
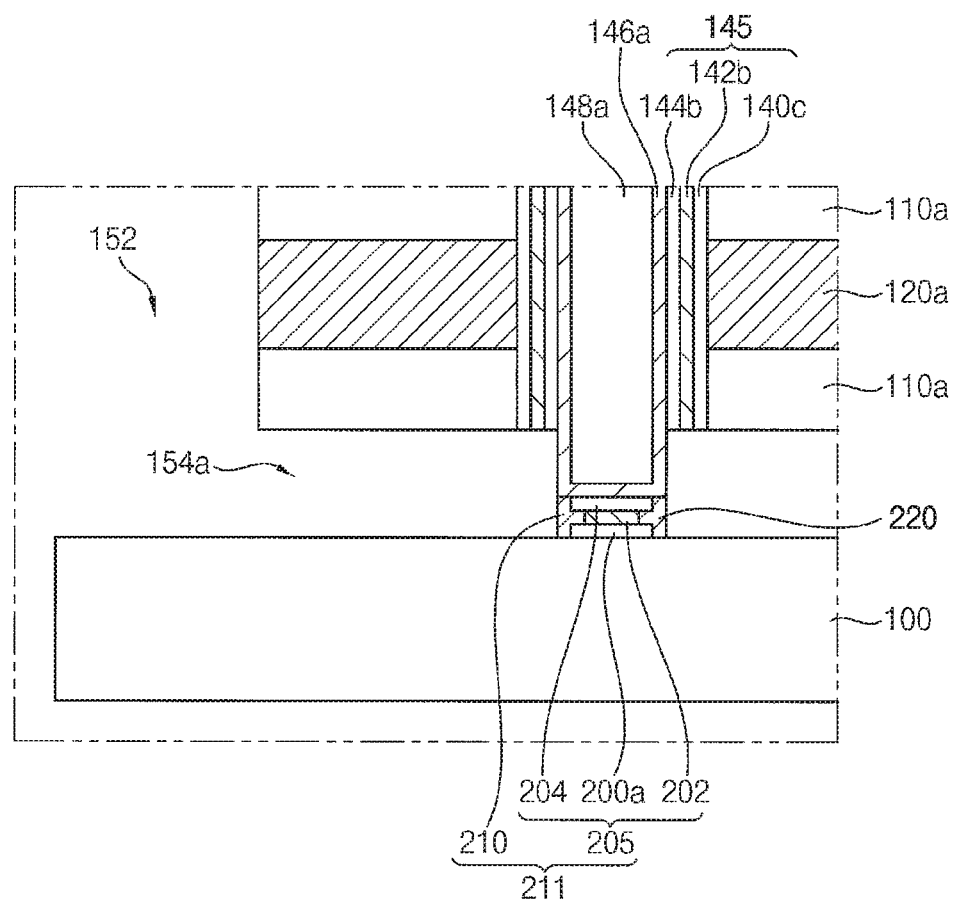

Referring to FIG. 31, a conductive layer may be formed on a sidewall and a bottom of the first opening 152, an inner wall of the first gap 154a, the upper insulation layer 124 (refer to FIG. 27) and a top surface of the pad 150 (refer to FIG. 27).

The conductive layer on the sidewall and the bottom of the first opening 152, the inner wall of the first gap 154a, the upper insulation layer 124 (refer to FIG. 27) and the pad 150 (refer to FIG. 27) may be isotropically etched by e.g., a wet etching process or an isotropic dry etching process, and the conductive layer in a groove defined by a bottom of the channel pattern 146a, a sidewall of the insulation structure 205 and the top surface of the substrate 100 may remain to form a conductive pattern 210.

Processes may be the same as or substantially the same as or similar to the processes illustrated with reference to FIGS. 15 and 16 may be performed.

Then, processes the same as or substantially the same as or similar to the processes illustrated with reference to FIGS. 17 to 21 may be performed, so that the semiconductor device shown in FIGS. 22 and 23 may be manufactured.

The above semiconductor device may be applied to various types of systems, e.g., computing system.

FIG. 32 is a block diagram illustrating a system in accordance with example embodiments.

Referring to FIG. 32, a data processing system 400 may include a central processing unit (CPU) 420 connected to a system bus 405, a random access memory (RAM) 430, a user interface 440, a modem 450 such as a baseband chipset, and a memory system 410. The memory system 410 may include a memory device 412 and a memory controller 411. The memory device 412 may include one of the above semiconductor devices in accordance with example embodiments. The memory device 412 may stably store data processed by the CPU 420 and/or inputting data. The memory controller 411 may control the memory device 412. The memory device 412 and the memory controller 411 may be coupled with each other, so that the memory system 410 may serve as a memory card or a solid state disk (SSD), etc. If the data processing system 400 is a mobile device, the system 400 may further include a battery for supplying voltage. In example embodiments, the data processing system 400 may further include, e.g., an application chipset, a camera image processor, a mobile DRAM.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While example embodiments have been particularly shown and described, it will be understood by one of ordinary skill in the art that variations in form and detail may be made therein without departing from the spirit and scope of the claims.

What is claimed is:

1. A semiconductor device, comprising:
   a substrate;
   a plurality of insulation patterns and a plurality of gates alternately and repeatedly stacked on the substrate;
   a channel pattern extending through the gates in a first direction substantially perpendicular to a top surface of the substrate;
   a semiconductor pattern between the channel pattern and the substrate;

a conductive pattern between the channel pattern and the semiconductor pattern, the conductive pattern electrically connecting the channel pattern to the semiconductor pattern, the conductive pattern contacting a bottom edge of the channel pattern and an upper surface of the semiconductor pattern; and an insulation structure including a plurality of stacked patterns, the insulation structure disposing between the channel pattern and the semiconductor pattern, wherein the insulation structure contacts an inner sidewall of the conductive pattern.

2. The semiconductor device of claim 1, wherein the conductive pattern includes polysilicon.

3. The semiconductor device of claim 1, wherein the conductive pattern directly contacts the bottom edge of the channel pattern.

4. The semiconductor device of claim 1, wherein the conductive pattern contacts the bottom edge and a lower sidewall of the channel pattern.

5. The semiconductor device of claim 1, further comprising:
a data storage structure between the channel pattern and the gates, wherein the data storage structure includes a tunnel insulation pattern, a charge storage pattern and a blocking pattern.

6. The semiconductor device of claim 5, wherein the conductive pattern contacts the bottom edge of the channel pattern, a lower sidewall of the channel pattern, and a bottom of the data storage structure.

7. The semiconductor device of claim 1, wherein the insulation structure directly contact a top surface of the semiconductor pattern, and
at least one of the stacked patterns protrudes from a different one of the stacked patterns in a lateral direction.

8. The semiconductor device of claim 7, wherein a width of each of the stacked patterns of the insulation structure is smaller than a width of a bottom of the channel pattern.

9. The semiconductor device of claim 1, further comprising:
a lower gate surrounding a sidewall of the semiconductor pattern, wherein
the lower gate extends in a direction parallel to the top surface of the substrate.

10. The semiconductor device of claim 1, wherein at least one of
an entire portion of the insulation structure is between a bottom surface of the channel pattern and the upper surface of the semiconductor pattern in the first direction, and
an entire portion of the conductive pattern is between the bottom edge of the channel pattern and the upper surface of the semiconductor pattern in the first direction.

11. A semiconductor device, comprising: a substrate; a plurality of gates on the substrate, the gates being spaced apart from each other and the substrate in a first direction substantially perpendicular to a top surface of the substrate; a channel structure extending through the gates in the first direction, the channel structure being spaced apart from the top surface of the substrate, and the channel structure including a channel pattern and a data storage structure extending along a sidewall of the channel pattern; a conductive pattern between the channel pattern and the substrate, the conductive pattern electrically connecting the channel pattern to the substrate, the conductive pattern contacting a bottom edge of the channel pattern and the top surface of the substrate, the conductive pattern includes a middle portion between a bottom portion and a top portion in the first direction, and the middle portion and the bottom portion have different widths in a second direction parallel to the top surface of the substrate; and an insulation structure between the channel pattern and the substrate, wherein the insulation structure contacts an inner sidewall of the conductive pattern, the insulation structure includes stacked patterns, and at least one of the stacked patterns protrudes from a different one of the stacked patterns in the second direction.

12. The semiconductor device of claim 11, wherein a bottom of the data storage structure is above a bottom of the channel pattern.

13. The semiconductor device of claim 11, further comprising:
a semiconductor pattern between the substrate and the conductive pattern; and
a lower gate surrounding a sidewall of the semiconductor pattern, wherein
the lower gate extends in a direction parallel to the top surface of the substrate.

14. A semiconductor device, comprising: a substrate; a channel pattern on the substrate, the channel pattern extending in a first direction that is vertical to a top surface of the substrate; a conductive pattern between the substrate and an edge part of a bottom surface of the channel pattern, the conductive pattern being electrically connected to the channel pattern through the edge part of the bottom surface of the channel pattern; an insulation structure between the substrate and the center part of the bottom surface of the channel pattern, the center part of the bottom surface of the channel pattern being on top of a top surface of the insulation structure, the conductive pattern surrounding the insulating structure; a data storage structure surrounding the channel pattern; a plurality of gates surrounding the data storage structure, the plurality of gates being spaced apart from each other in the first direction above the substrate; and a semiconductor pattern on the substrate, wherein the conductive pattern is on top of the semiconductor pattern, and the conductive pattern electrically connects the channel pattern to the semiconductor pattern, an entire portion of the insulation structure is between the center part of the bottom surface of the channel pattern and an upper surface of the semiconductor pattern in the first direction, and an entire portion of the conductive pattern is between the bottom edge of the channel pattern and an upper surface of the semiconductor pattern in the first direction.

15. The semiconductor device of claim 14, wherein
the insulating structure includes a first pattern, a second pattern, and a third pattern sequentially stacked on top of each other and surrounded by the conductive pattern,
a width of the second pattern is different than a width of the first and third patterns.

16. The semiconductor device of claim 15, wherein
the data storage structure includes a tunnel insulating pattern, a charge storage pattern, and a blocking pattern, and
the first to third patterns includes the same materials as the blocking pattern, the charge storage pattern, and the tunnel insulating pattern, respectively.

* * * * *